(12) United States Patent
Kim et al.

(10) Patent No.: US 6,960,507 B2
(45) Date of Patent: Nov. 1, 2005

(54) VERTICAL DOUBLE-CHANNEL SILICON-ON-INSULATOR TRANSISTOR AND METHOD OF MANUFACTURING THE SAME

(75) Inventors: Ji-Young Kim, Yongin (KR); Jin-Jun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/759,239

(22) Filed: Jan. 20, 2004

(65) Prior Publication Data

US 2005/0017289 A1 Jan. 27, 2005

(30) Foreign Application Priority Data

Jul. 24, 2003 (KR) ...................... 10-2003-0050938

(51) Int. Cl.[7] .......................................... H01L 21/336
(52) U.S. Cl. ...................... 438/270; 438/156; 438/206; 438/212; 438/268
(58) Field of Search .............................. 438/156, 206, 438/212, 268, 270

(56) References Cited

U.S. PATENT DOCUMENTS

| | | | |
|---|---|---|---|
| 5,312,782 A | 5/1994 | Mayazawa | 437/235 |
| 6,268,630 B1 | 7/2001 | Schwank et al. | 257/347 |
| 6,429,055 B2 | 8/2002 | Oh | 438/149 |
| 6,515,348 B2 | 2/2003 | Hueting et al. | |
| 6,706,571 B1 | 3/2004 | Yu et al. | |
| 6,709,982 B1 | 3/2004 | Buynoski et al. | |

FOREIGN PATENT DOCUMENTS

JP          11-150265          6/1999

OTHER PUBLICATIONS

Choi, et al., "A Spacer Patterning Technology for Nanoscale CMOS".
IEEE Transactionson Electron Devices, vol. 49, No. 3, pp. 436-441 (Mar. 2002).

*Primary Examiner*—Long Pham
(74) *Attorney, Agent, or Firm*—Lee & Morse, P.C.

(57) ABSTRACT

A vertical double channel silicon-on-insulator (SOI) field-effect-transistor (FET) includes a pair of two vertical semiconductor layers in contact with a pair of parallel shallow trench isolation layers on a substrate, a source, a drain and a channel region on each of the pair of vertical semiconductor layers with corresponding regions on the pair of vertical semiconductor layers facing each other in alignment, a gate oxide on the channel region of both of the pair of the vertical semiconductor layers, and a gate electrode, a source electrode, and a drain electrode electrically connecting the respective regions of the pair of vertical semiconductor layers.

48 Claims, 27 Drawing Sheets

US 6,960,507 B2

VERTICAL DOUBLE-CHANNEL SILICON-ON-INSULATOR TRANSISTOR AND METHOD OF MANUFACTURING THE SAME

FIELD OF THE INVENTION

The present invention relates to a metal-oxide-semiconductor field effect transistor (MOSFET) and a method of manufacturing the same. More particularly, the present invention relates to a vertical double-channel silicon-on-insulator MOSFET and a method of manufacturing the same.

DESCRIPTION OF THE RELATED ART

In recent years, devices made on silicon-on-insulator (SOI) substrates have been used in many applications. When the devices are made on SOI substrates, junction leakage currents and parasitic junction capacitances are reduced. A small junction leakage current results in a low power dissipation and, consequently, a relatively long lifetime for the DC supply. A low parasitic junction capacitance facilitates obtaining a high device speed.

FIG. 1 illustrates a structure of a conventional lateral channel SOI complementary MOSFET device.

Referring to FIG. 1, an N-channel transistor 12 and a P-channel transistor 14 include a buried oxide layer 20 and a mono-crystalline layer 22 formed on a substrate 18. A stack 16 includes the substrate 18, the buried oxide layer 20 and the mono-crystalline silicon layer 22. A conventional separation by implantation of oxygen (SIMOX) method can be used to form the buried oxide layer 20. In this device structure, isolated device islands 28 are formed by oxide filled trenches 30. Reference numeral 36 indicates an interface between the buried oxide layer 20 and the isolated islands 28. The device further includes transistor source and drain regions 52 and 54, respectively. Lightly doped regions 48 surround the source and drain regions 52 and 54. A transistor gate 38 is formed over a central portion of the isolated island 28. The transistor gate 38 includes an oxide layer on an upper surface of the island 28 and a patterned polysilicon layer. A body contact of the transistor 56 is formed in contact with the source region 52. Electrical contacts 58 are made on the patterned polysilicon layer of the transistor gate 38 and the source and drain regions 52 and 54.

A feature of this device structure is that it does not require a wafer bonding process step. Lateral channel SOI transistors, such as the one illustrated in FIG. 1, however, are planar devices that require a large transistor area on the substrate surface for improving the device performance quantities, such as "on" current. Accordingly, vertical channel SOI device structures, which provide enhanced performance without requiring additional area on the wafer surface present a promising alternative. A conventional vertical SOI transistor, however, may require complicated processing steps, such as a flip wafer bonding, after a portion of the device structure has been formed on a first wafer.

FIG. 2 illustrates a structure of a conventional vertical channel SOI MOSFET device.

Referring to FIG. 2, a structure of the conventional vertical channel SOI MOSFET device includes a source region 19, a channel region 11a, and a drain region 26. The device structure further includes a polysilicon drain 15 and source electrodes 24. A groove 20 is formed through the source region 19 and the channel region 11a and a gate oxide layer 21 is subsequently formed on a bottom and sidewalls of the groove 20. The groove 20 is subsequently filled with a polysilicon gate electrode 22. The active device area is covered on sides and a bottom part by an insulating film 16. An insulating film 23 is formed on the device surface and a poly gate wiring film 25 is formed on top of the gate electrode 22. A polysilicon film 17 is intended for flip wafer bonding. Layers 26, 15, 16 and 17 are formed on a surface of a first wafer (not shown) before transferring the partially completed device structure on the surface of the first wafer onto a second wafer 18 by flip wafer bonding followed by etching or polishing of the first wafer until the insulating film 16 is exposed. The remainder of the device processing is performed after the partially completed device structure on the first wafer is completed.

Processing of the device structure illustrated in FIG. 2 requires complicated device processing steps and an expensive flip wafer bonding step. The substrate 18 surface area occupied by the transistor is large. Accordingly, the conventional vertical channel SOI device structure of FIG. 2 is not suitable for high-density device integration.

SUMMARY OF THE INVENTION

In an effort to solve at least some of the above-described problems, a feature of the present invention is to provide a vertical double-channel silicon-on-insulator (SOI) field-effect-transistor (FET). In addition, another feature of the present invention is to provide methods of manufacturing the vertical double-channel silicon-on-insulator transistor.

According to an embodiment of the present invention, a vertical double channel silicon-on-insulator (SOI) field-effect-transistor (FET) includes a pair of two vertical semiconductor layers in contact with a pair of parallel shallow trench isolation layers on a substrate, a source, a drain and a channel region on each of the pair of vertical semiconductor layers with corresponding regions on the pair of vertical semiconductor layers facing each other in alignment, a gate oxide on the channel region of both of the pair of the vertical semiconductor layers, and a gate electrode, a source electrode, and a drain electrode electrically connecting the respective regions of the pair of vertical semiconductor layers. According to a feature of the present invention, the vertical double channel silicon-on-insulator (SOI) field-effect-transistor (FET) of this embodiment may further include a bottom channel, having a higher threshold voltage than a threshold voltage of the channel region on each of the pair of vertical semiconductor layers, formed on the substrate. According to another feature of the present invention, the vertical double channel silicon-on-insulator (SOI) field-effect-transistor (FET) of this embodiment may further include an insulator layer on top of the pair of parallel shallow trench isolation layers, on top of the substrate in between the pair of two vertical semiconductor layers, and in between middle portions of the pair of two vertical semiconductor layers on both sides of the gate electrode. According to yet another feature of the present invention, the vertical double channel silicon-on-insulator (SOI) field-effect-transistor (FET) is of planar type. According to still another feature of the present invention, in the vertical double channel silicon-on-insulator (SOI) field-effect-transistor (FET), the gate electrode may be formed of either tungsten silicide or tungsten and the source/drain electrode may be formed of either doped polysilicon or tungsten. According to a feature of the present invention, in the vertical double channel silicon on insulator (SOI) field effect transistor (FET) a depth of the pair of two vertical semiconductor layers is approximately ⅔ of a depth of the pair of parallel shallow trench isolation layers.

According to another embodiment of the present invention, a vertical double channel silicon on insulator (SOI) field effect transistor (FET) includes a substrate having an active region, a pair of vertical shallow trench isolation (STI) regions in the active region of the substrate and extending in a longitudinal direction, a pair of vertical source/drain regions adjacent to the pair of vertical shallow trench isolation regions with a transistor channel region between the source/drain regions in the active region of the substrate and extending in the longitudinal direction, a bottom channel, having a higher threshold voltage than a threshold voltage of the transistor channel, formed on the substrate and in contact with both of the pair of vertical source/drain regions, a first oxide layer formed on and above the pair of vertical shallow trench isolation regions, a source/drain electrode formed within the first oxide layer, the source/drain electrode being formed on the pair of vertical source/drain regions, a gate oxide layer formed between the pair of vertical source/drain regions on the bottom channel, the gate oxide layer formed in a lateral direction at a midsection of the substrate, and a gate electrode formed on the pair of shallow trench isolation regions and the gate oxide layer.

The device may further include a gate mask formed on the gate electrode. The device may further include a second oxide layer formed on the bottom channel and between the pair of vertical source/drain regions adjacent to the gate electrode. The device may further include a sidewall spacer formed on an upper surface of the vertical source/drain regions. Preferably, the gate mask is a silicon nitride layer.

Preferably, the pair of vertical shallow trench isolation regions have a depth of about 3000 Å and the vertical source/drain regions have a depth of about 2000 Å.

According to yet another embodiment of the present invention, a method of manufacturing a vertical double channel silicon-on-insulator (SOI) field effect transistor (FET) includes forming a pair of shallow trench isolation (STI) regions in an active region of a substrate so that an upper surface of the shallow trench isolation regions protrudes above an upper surface of the substrate, performing a first ion implantation process on the active region of the substrate to form a pair of vertical transistor channels and a bottom channel, wherein the pair of vertical transistor channels and the bottom channel extend in a longitudinal direction, forming sidewall spacers on the active region of the substrate above the pair of vertical transistor channels and adjacent to the protruding portion of the pair of shallow trench isolation regions, etching the active region of the substrate, using the sidewall spacers as a mask, to expose the pair of vertical transistor channels and the bottom channel, wherein the pair of vertical transistor channels and the bottom channel define a trench, performing a second ion implantation process on the exposed bottom channel, forming a gate oxide layer between the pair of vertical transistor channels on the bottom channel in a lateral direction at a midsection of the substrate, forming a gate electrode on the gate oxide layer, the sidewall spacers, and an upper surface of the pair of vertical shallow trench isolation regions, performing a third ion implantation process on the exposed pair of vertical transistor channels to form a pair of vertical source/drain regions, depositing an oxide layer on the bottom channel, the sidewall spacers, and an upper surface of the shallow trench isolation regions so that the oxide layer is adjacent to the gate oxide layer and the gate electrode, the oxide layer filling the trench, etching the oxide layer to expose an upper portion of the pair of vertical source/drain regions, and forming a source/drain contact electrode on the bottom channel and between the pair of vertical source/drain regions so that an upper surface of the source/drain contact electrode is even with an upper surface of the gate mask.

According to this first embodiment of the method of manufacturing, the first ion implantation process may be a low dose implantation performed at an implant angle of 0°. The second ion implantation process may be a high dose implantation performed at an angle of 0°. The third ion implantation process may be performed at a tilted implant angle of 7°. More preferably, the third ion implantation process is a plasma doping process.

According to still another embodiment of the present invention, a method of manufacturing a vertical double channel silicon-on-insulator (SOI) field effect transistor (FET) includes forming a pair of shallow trench isolation (STI) regions in an active region of a substrate so that an upper portion of the shallow trench isolation regions protrudes above an upper surface of the substrate, forming sidewall spacers on the active region of the substrate adjacent to the protruding portion of the pair of shallow trench isolation regions, etching the active region of the substrate, using the sidewall spacers as a mask, to define a trench, performing a first ion implantation process on sidewalls and a bottom portion of the trench to form a pair of vertical transistor channels and a bottom channel, respectively, wherein the pair of vertical transistor channels and the bottom channel extend in a longitudinal direction, forming a gate oxide layer between the pair of vertical transistor channels on the bottom channel in a lateral direction at a midsection of the substrate, forming a gate electrode on the gate oxide layer, the sidewall spacers, and an upper surface of the pair of vertical shallow trench isolation regions, performing a second ion implantation process on the exposed pair of vertical transistor channels to form a pair of vertical source/drain regions, depositing an oxide layer on the bottom channel, the sidewall spacers, and an upper surface of the shallow trench isolation regions, wherein the oxide layer is adjacent to the gate oxide layer and the gate electrode, the oxide layer filling the trench, etching the oxide layer to expose an upper portion of the pair of vertical source/drain regions, and forming a source/drain contact electrode on the bottom channel and between the pair of vertical source/drain regions so that an upper surface of the source/drain contact electrode is even with an upper surface of the gate mask.

According to this second embodiment of the method of manufacturing, the first ion implantation process may be a tilted low dose ion implantation process to form the pair of vertical transistor channels and a zero angle high dose ion implantation process to form the bottom channel. More preferably, the first ion implantation process is a plasma doping process. The second ion implantation process may be performed at a tilted implant angle of 7°. More preferably, the second ion implantation process is a plasma doping process.

According to either method of manufacturing the present invention, the method may further include forming a gate mask on the gate electrode after forming the gate electrode. Forming the pair of STI regions may include depositing a mask layer on the substrate, performing an anisotropic etching process to remove the mask layer and form a pair of trench regions, and filling the pair of trench regions with an insulating layer. Preferably, the mask layer is a silicon nitride layer. Preferably, the etching process to remove the mask layer is a wet etching.

Forming the sidewall spacer may include depositing a spacer layer on an upper surface of the substrate including the protruding portion of the shallow trench isolation region, and etching the spacer layer using an anisotropic etching method to form the sidewall spacers adjacent to the protruding portion of the shallow trench isolation region. The spacer layer may be formed by either a low-pressure chemical vapor deposition (LPCVD) silicon nitride or a plasma-enhanced chemical vapor deposition (PECVD) silicon nitride. Preferably, the spacer layer is deposited to a thickness of between about 500 Å to 800 Å.

Preferably, the sidewall spacers have a thickness of about 500 Å. Preferably, the gate oxide layer is a thermally grown oxide.

Forming the gate electrode and forming the gate mask may include depositing the gate electrode on the gate oxide layer, the sidewall spacers, and an upper surface of the pair of vertical shallow trench isolation regions using a low pressure chemical vapor deposition (LPCVD) process, planarizing the gate electrode layer using a chemical mechanical polishing (CMP), depositing the gate mask on the planarized gate electrode layer using a LPCVD process, and patterning the gate mask and the gate electrode using photolithography and etching. Preferably, the gate electrode is formed of either tungsten silicide or tungsten and the gate mask is a silicon nitride layer.

The source/drain contact electrode may be formed of either doped polysilicon or tungsten. The trench may be etched using a reactive ion etching (RIE) to a depth of about 2000 Å. The shallow trench isolation regions may have a depth of about 3000 Å.

Preferably, the bottom channel has a high threshold voltage of equal to or greater than about 2 V.

Preferably, an etching depth of the trench is approximately ⅔ of a depth of the shallow trench isolation region.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 4a through 13e illustrate schematic cross-sectional views, top views and perspective three-dimensional views for explaining stages in a method of manufacturing a vertical double-channel SOI transistor structure according to embodiments of the present invention. More specifically, FIGS. 4a, 5a, 6a, 7a, 8a, 9a, 10a, 11a, 12a, and 13a illustrate cross-sectional views taken along a line A–B–C of FIG. 3. FIGS. 4d, 5e, 6d, 7d, 8d, 9e, 10d, 11e, 12e, and 13e illustrate three-dimensional perspective views.

DETAILED DESCRIPTION OF THE INVENTION

Figure 1:
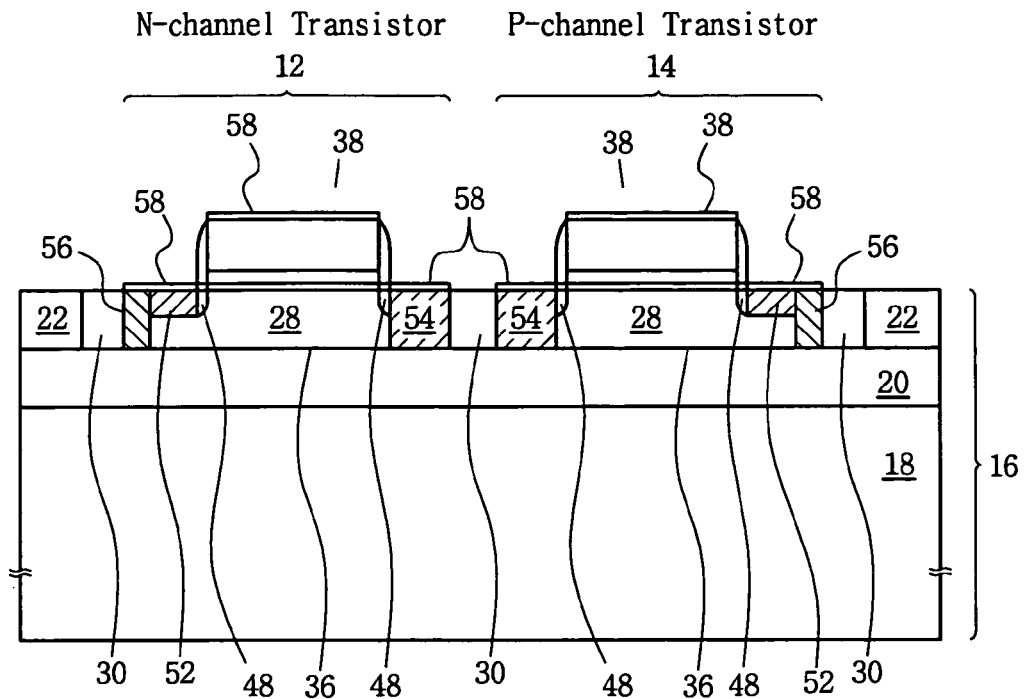
FIG. 1 illustrates a structure of a conventional lateral channel SOI complementary MOSFET device.
Figure 2:
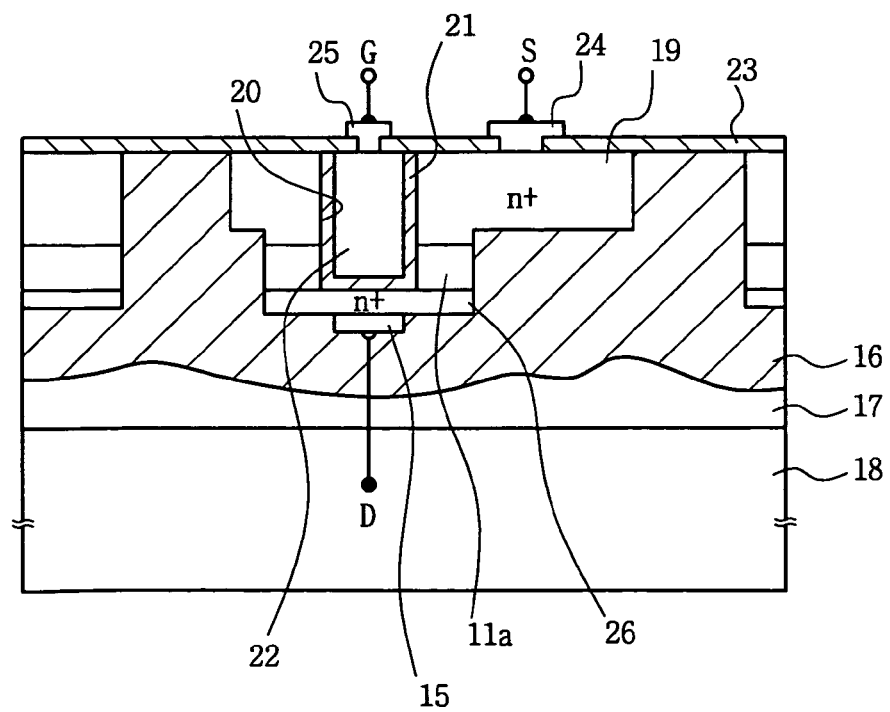
FIG. 2 illustrates a structure of a conventional vertical channel SOI MOSFET device.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals in different drawings represent like elements.

Figure 3:
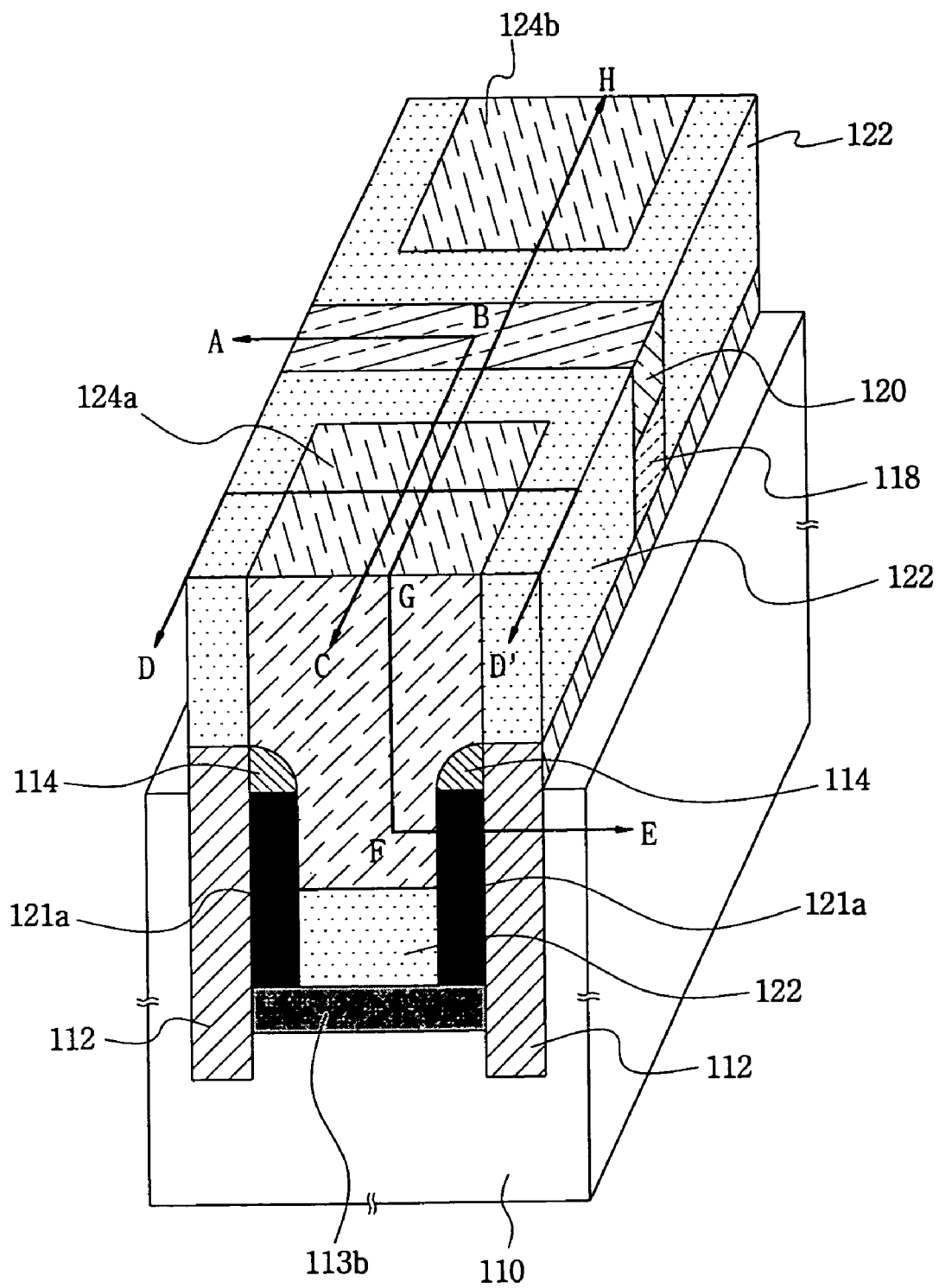
FIG. 3 illustrates a perspective three-dimensional view of a vertical double-channel SOI transistor structure according to an embodiment of the present invention.
Figure 4A:
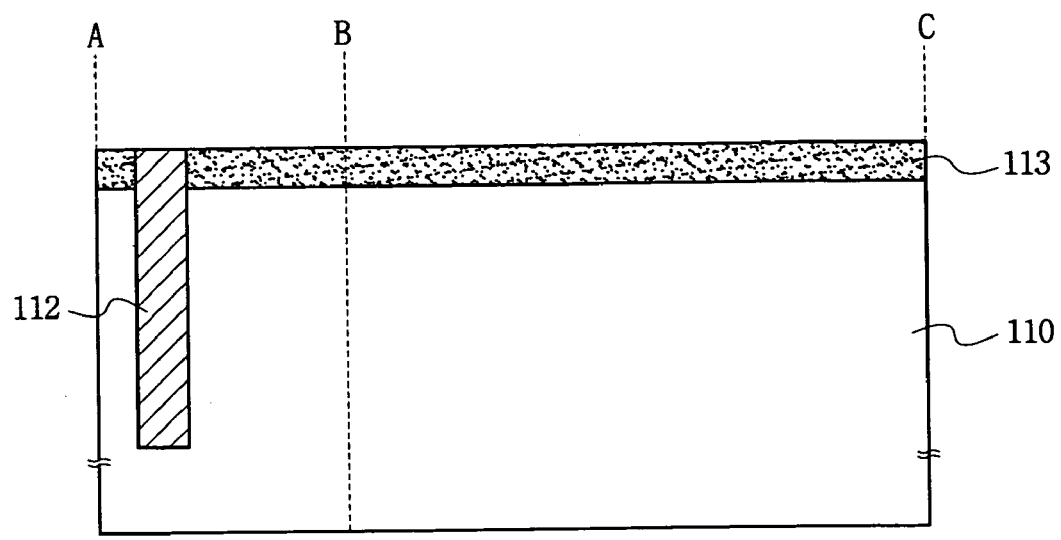
Figure 4B:
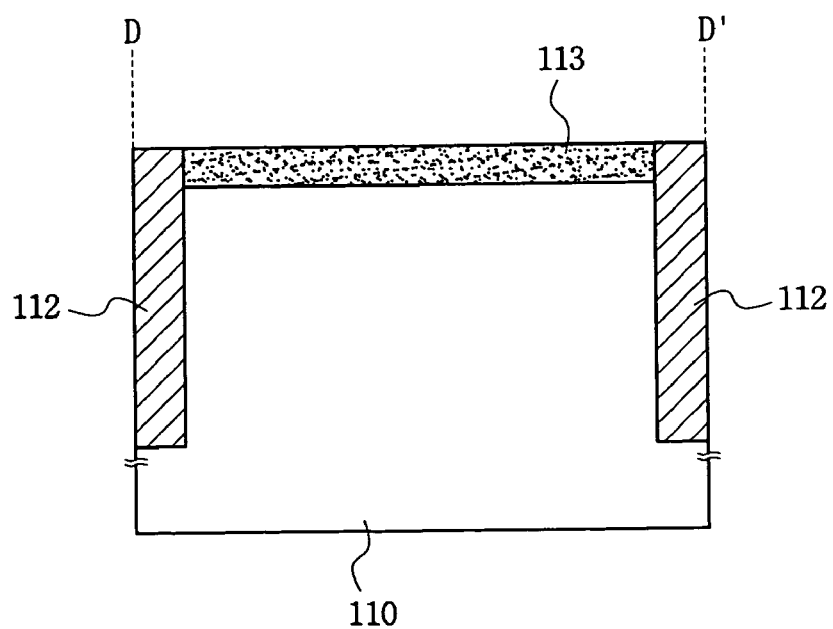
FIGS. 4b, 5b, 6b, 7b, 8b, 9b, 10b, 11b, 12b, and 13b illustrate cross-sectional views taken along a line D–D' of FIG. 3.
Figure 4C:
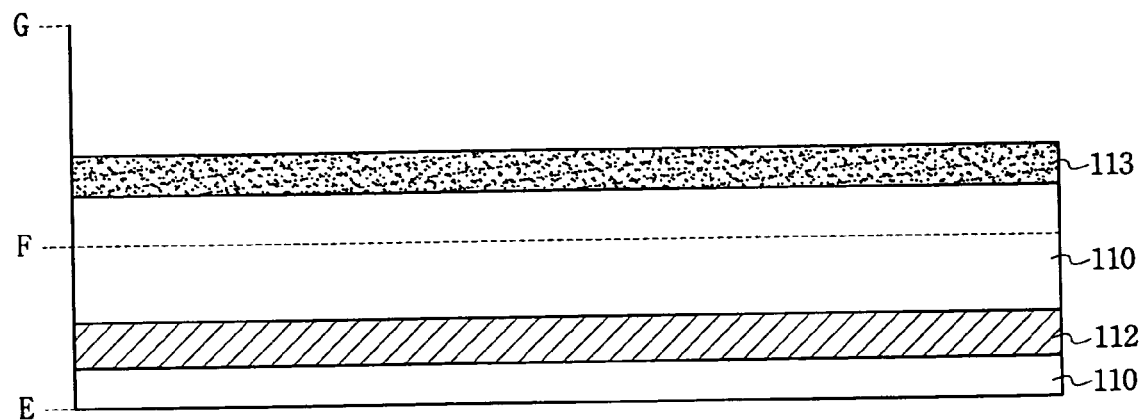
FIGS. 4c, 5c, 6c, 7c, 8c, 9c, 10c, 11c, 12c, and 13c illustrate cross-sectional views taken along a line E–F–G of FIG. 3.
Figure 4D:
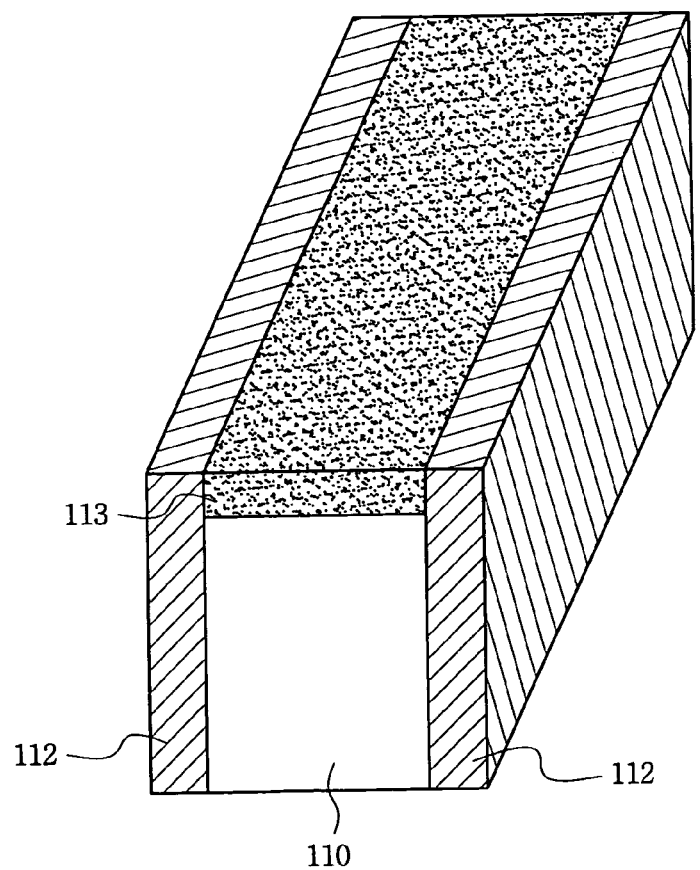
Figure 5A:
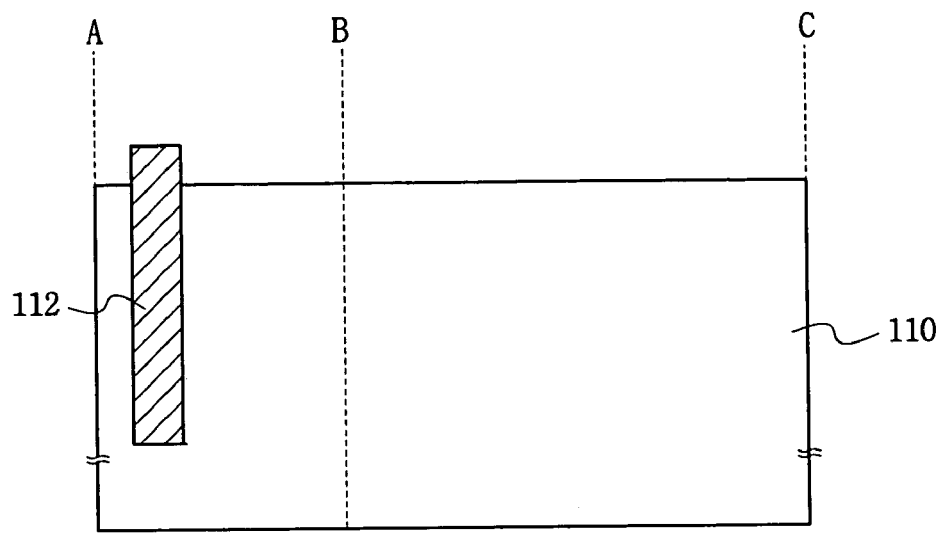
Figure 5B:
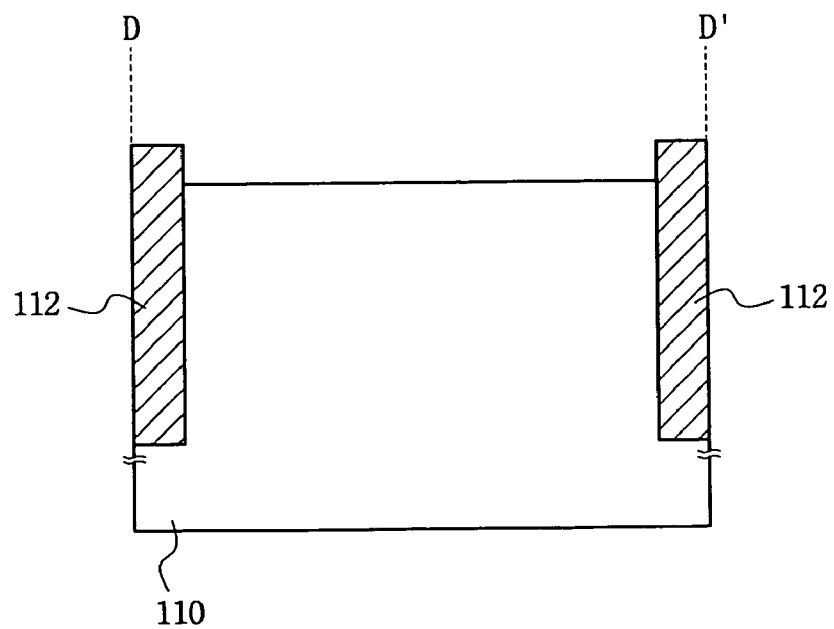
Figure 5C:
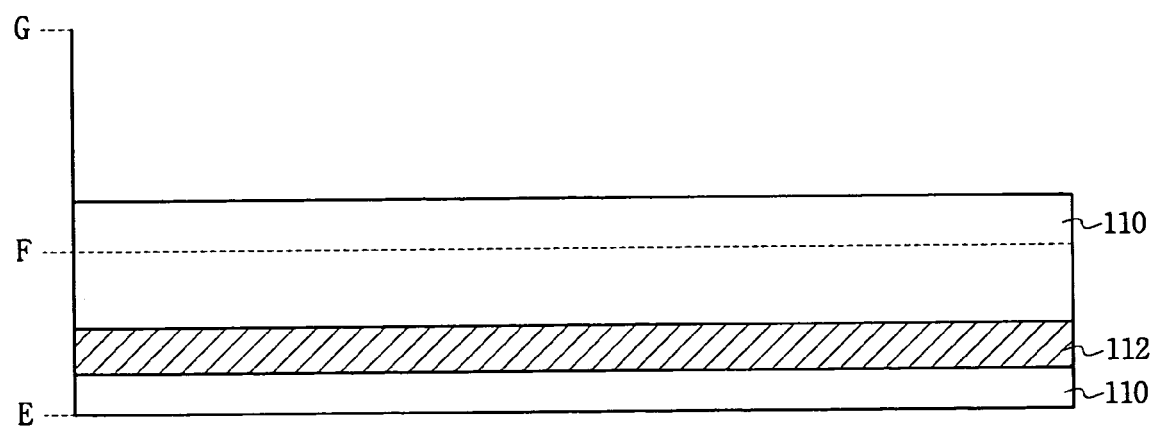
Figure 5D:
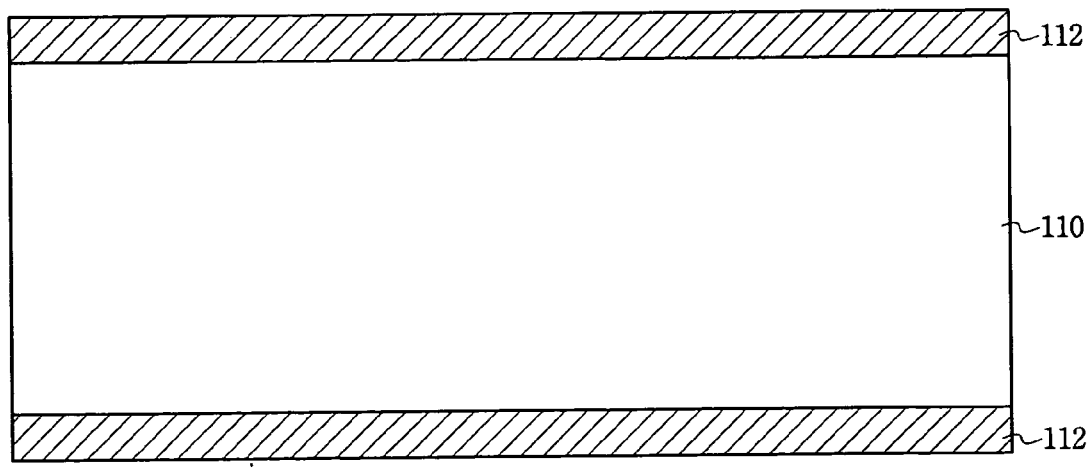
FIGS. 5d, 9d, 11d, 12d, and 13d illustrate top views.
Figure 5E:
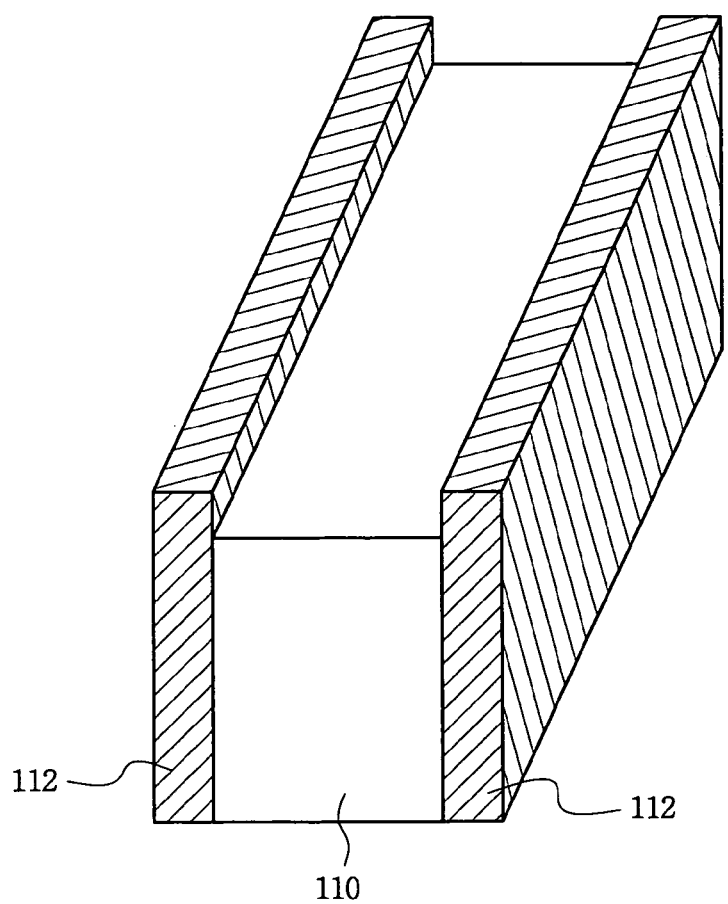
Figure 6A:
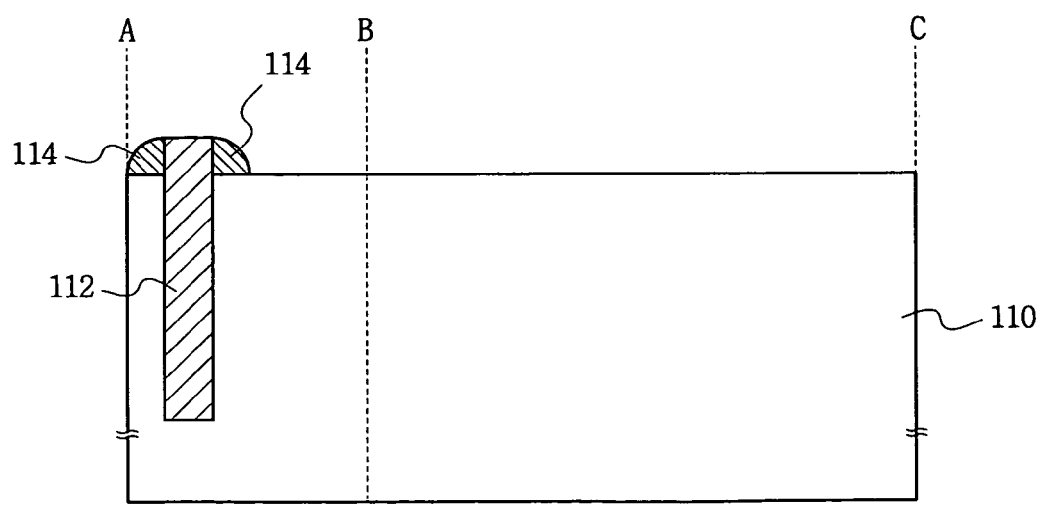
Figure 6B:
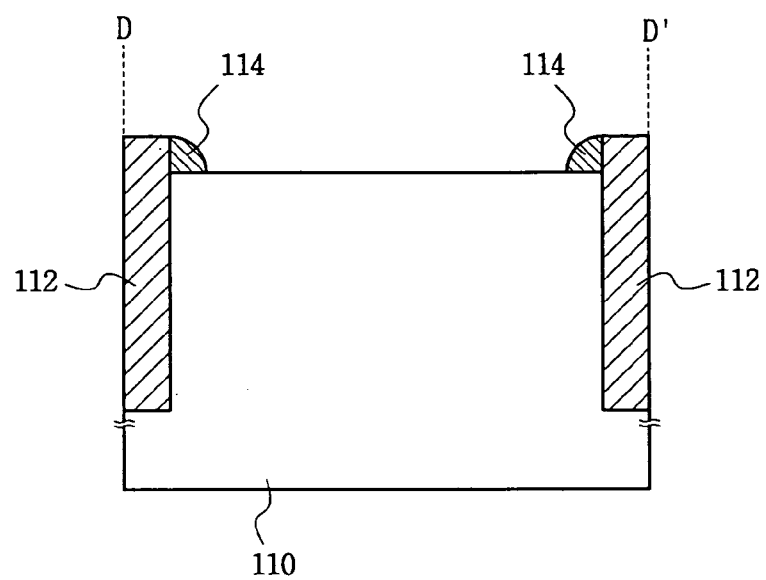
Figure 6C:
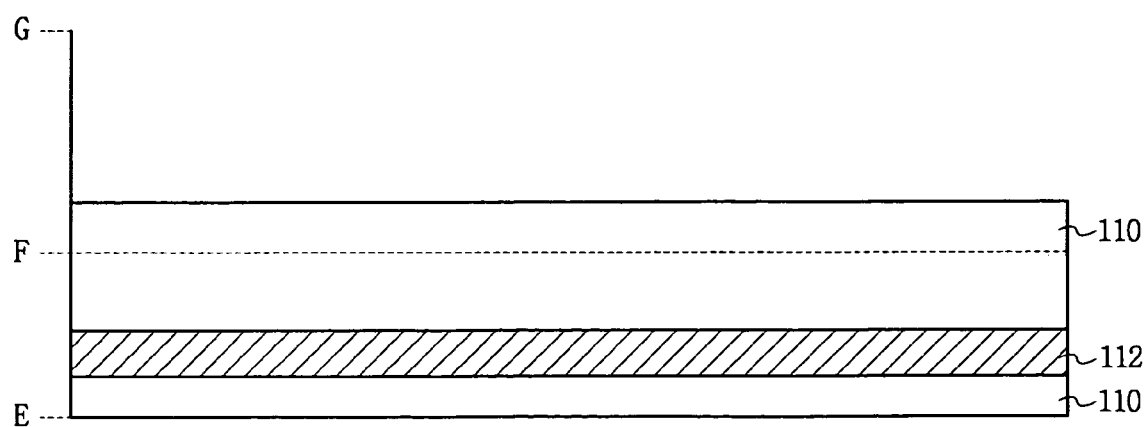
Figure 6D:
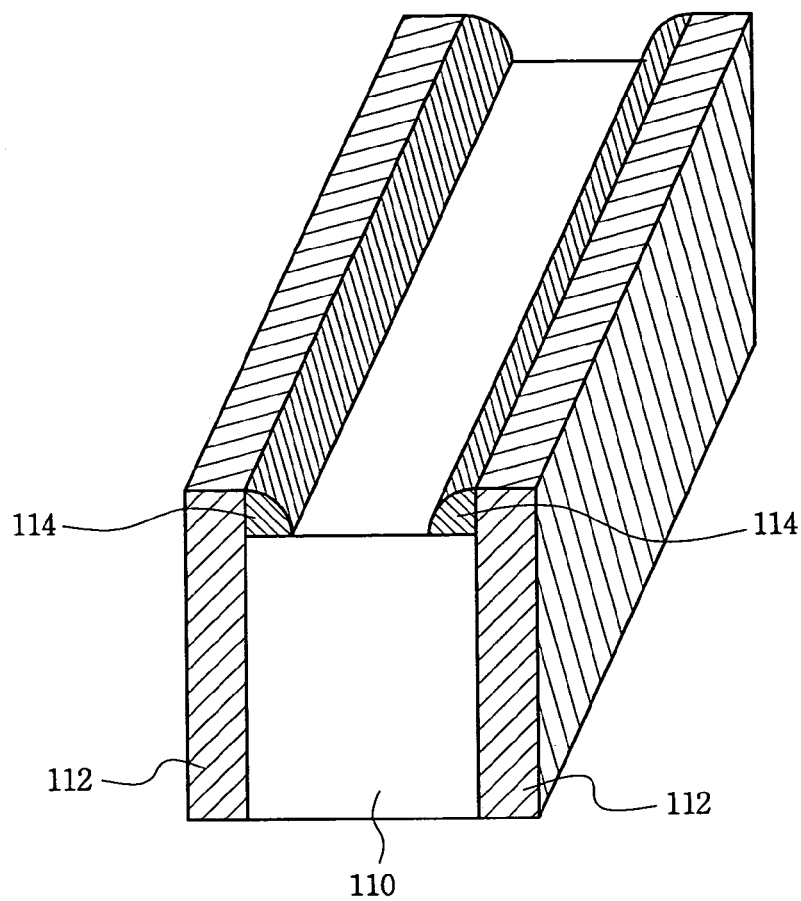
Figure 7A:
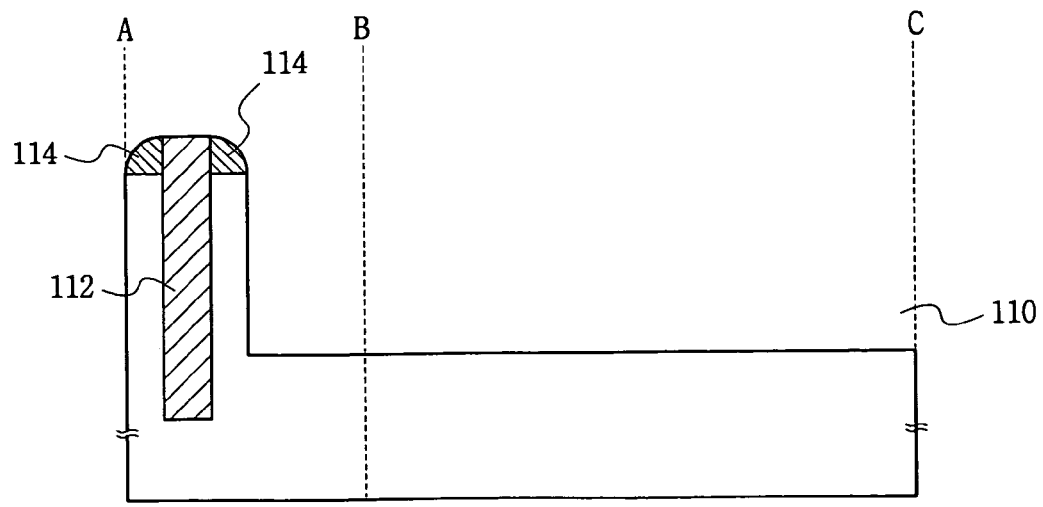
Figure 7B:
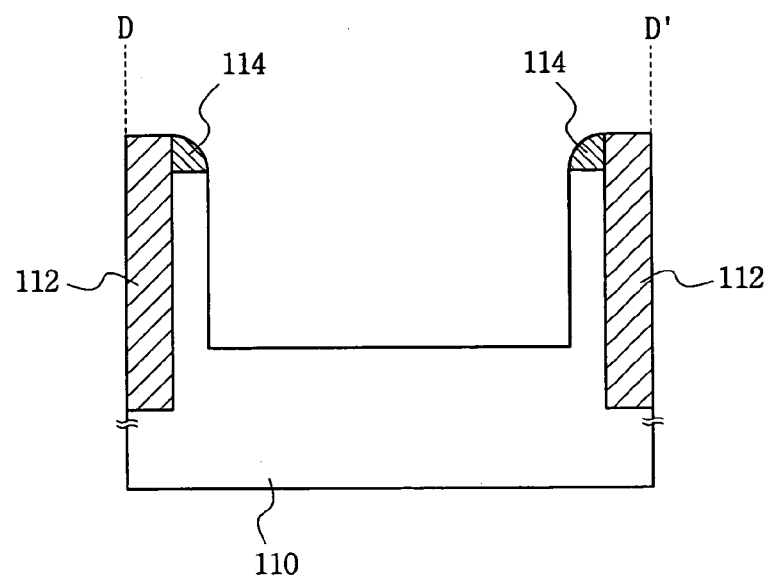
Figure 7C:
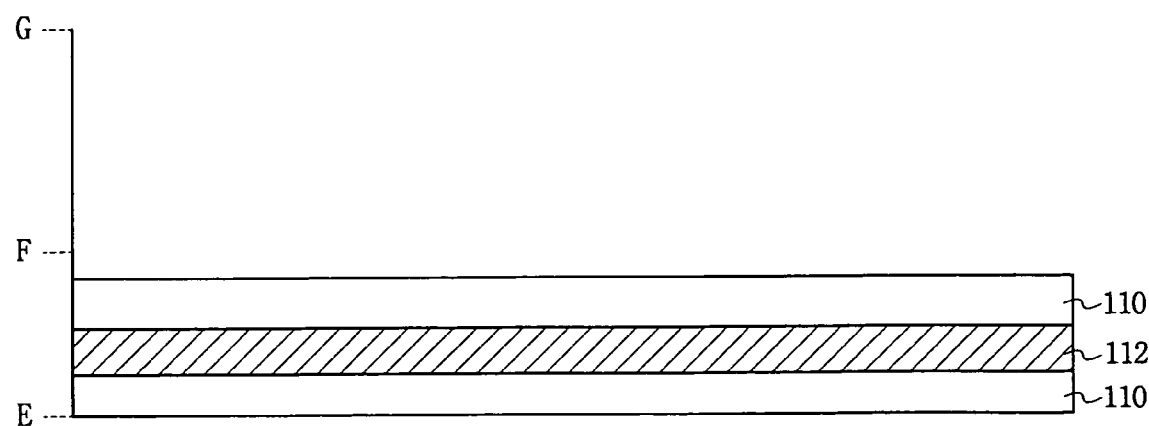
Figure 7D:
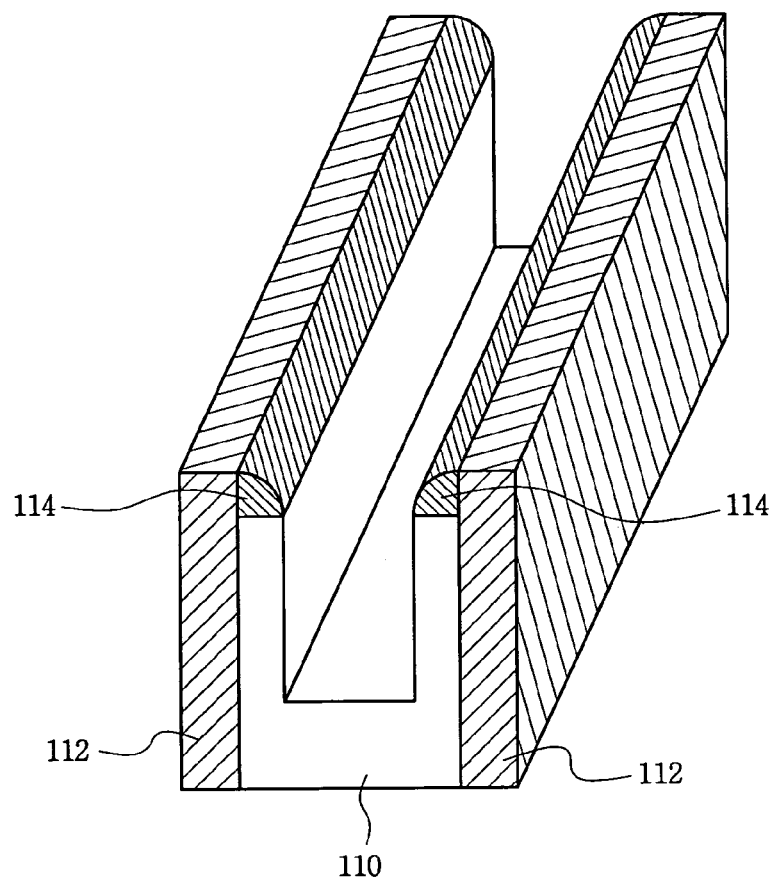

FIG. 3 illustrates a perspective three-dimensional view of a vertical double-channel SOI transistor structure according to an embodiment of the present invention.

Referring to FIG. 3, a source, a drain, and a channel region of a vertical double-channel SOI transistor are formed (not all regions are visible in this view) in a substrate 110 on two parallel vertical semiconductor layers 121a. A shallow trench isolation (STI) layer 112 is adjacent to the two parallel vertical semiconductor layers 121a. An upper portion of the STI layer 112 protrudes above an upper surface of the substrate 110. A spacer 114 formed on sidewalls of the protruding portion of the STI layer 112 facilitates the formation of the parallel vertical semiconductor layers 121a adjacent to the STI layer 112 during an etching of a trench in an active area of the substrate 110. A depth of the parallel vertical semiconductor layers 121a is less than a depth of the STI layer 112. The depth of the parallel vertical semiconductor layers 121a is preferably about ⅔ of the depth of the STI layer 112.

After being heavily doped, the vertical semiconductor layers 121a become source/drain regions. In addition, a bottom channel portion 113b of the trench is heavily doped. A channel region (not shown) is formed in-between the source/drain regions at a longitudinal midsection of both vertical semiconductor layers 121a. A gate oxide layer (not shown) is formed on the channel region, which is lightly doped as compared to the source/drain regions 121a. A gate electrode 118 and a gate mask 120 are formed above the gate oxide layer (not shown).

An insulator layer 122 is formed on top of the shallow trench isolation layer 112 and at the midsection of the trench next to the gate electrode 118 and the gate mask 120 to a same level as the gate mask 120. The insulator layer 122 may additionally be formed in the trench on top of the heavily doped bottom channel surface 113b so that the insulator layer 122 partially fills the trench and exposes an upper portion of the source/drain regions on the vertical semiconductor layer sidewalls 121a.

Source/drain electrodes 124a and 124b are formed in the trench for electrically connecting the source/drain regions 121a of the parallel vertical semiconductor layer sidewalls across the trench. This structure results in one source and one drain electrode for the dual-channel vertical SOI MOSFET structure. In this embodiment, the source/drain parasitic resistance is decreased because the source/drain electrodes 124a and 124b directly contact the heavily doped source/drain regions of the parallel vertical semiconductor layer sidewalls 121a. According to the device structure of the embodiment as shown in FIG. 3, when the insulator layer 122 is additionally present on the bottom channel surface 113b the source/drain (S/D) electrodes 124a and 124b do not directly contact the heavily doped trench bottom channel surface 113b.

A doping concentration of the heavily doped trench bottom channel 113b is chosen such that no inversion layer is formed on a surface thereof during normal operation for the DC source voltages used in the circuit. Accordingly, no spurious conducting channels are created on the horizontal semiconductor substrate surface. In the device structure of the embodiment of the present invention as shown in FIG. 3, the parallel vertical semiconductor layer sidewalls 121a are formed using a spacer 114 during an etch process. A trench recess depth can be used to control a transistor channel width.

The SOI device structure of the present invention is preferably made on a bulk silicon wafer 110. In the final device structure, upper surfaces of the source/drain electrodes 124a and 124b, the gate mask 120 and the insulator layer 122 are at a same level, thereby yielding planarity. Further, the gate electrode is preferably formed of tungsten silicide or tungsten, the gate mask layer may be formed of a silicon nitride layer, and the source/drain contact electrode may be formed of doped polysilicon or tungsten. The STI regions preferably have a depth of about 3000 Å. The vertical source/drain regions preferably have a depth of about 2000 Å. The structure of the device of the present invention will be more apparent after processing details of the present invention are presented as described below.

FIGS. 4a through 13e illustrate schematic cross-sectional, top and three-dimensional perspective views showing stages in a method of manufacturing a vertical double-channel transistor structure according to an embodiment of the present invention. More specifically, FIGS. 4a, 5a, 6a, 7a, 8a, 9a, 10a, 11a, 12a, and 13a illustrate cross-sectional views taken along a line A–B–C of FIG. 3; FIGS. 4b, 5b, 6b, 7b, 8b, 9b, 10b, 11b, 12b, and 13b illustrate cross-sectional views taken along a line D–D' of FIG. 3; FIGS. 4c, 5c, 6c, 7c, 8c, 9c, 10c, 11c, 12c, and 13c illustrate cross-sectional views taken along a line E–F–G of FIG. 3; FIGS. 5d, 9d, 11d, 12d, and 13d illustrate top views; and FIGS. 4d, 5e, 6d, 7d, 8d, 9e, 10d, 11e, 12e, and 13e illustrate three-dimensional perspective views.

Referring to FIGS. 4a through 4e, a mask layer 113 is formed on the substrate 110. The mask layer 113 is preferably a nitride layer and is preferably formed by a low-pressure-chemical-vapor-deposition (LPCVD) process. A field isolation region 112 is formed in the substrate 110 for defining an active region, wherein the device structure will be formed. The field isolation region 112 is preferably a shallow-trench-isolation (STI). The STI layer 112 may be formed by a well-known method of anisotropically etching a trench surrounding the active region 110, depositing an insulation layer on the trench, and planarizing the insulation layer using an etch-back process, preferably a chemical-mechanical-polishing (CMP) process. Reference numeral 110 denotes both the active device region and the substrate used for manufacturing the device of the present invention. The active device region of the substrate 110 is protected by the mask layer 113 during shallow trench formation in the substrate 110 by etching. The STI depth is preferably about 3000 Å. The STI depth is selected based on the desired transistor channel width.

Referring to FIGS. 5a through 5d, the nitride mask layer 113 is removed on the active device region 110, by a wet etching process. In the resultant structure, the STI layer 112 protrudes from the substrate 110 surface.

In an embodiment of the present invention, on the resultant structure, illustrated in FIGS. 5a through 5d, a threshold voltage ($V_{th}$) control dopant is introduced in the active device region of the substrate 110 using an optional ion implantation process. Preferably, a projected range of the implanted ions is about 1000 Å. The implanted specie may be $BF_2^+$ if the substrate 110 is of a p-type silicon material. Preferably, the substrate is not tilted during this ion implantation. This ion implantation step results in lightly doped vertical semiconductor regions 113a after performance of a reactive-ion-etching (RIE) step to form a trench, as will be subsequently described with reference to FIGS. 8a to 8d. A middle portion of the doped vertical semiconductor regions 113a is used as the vertical channel region. Doping of the bottom channel 113b (if the initial ion implantation doping is used for the doped vertical semiconductor regions 113a) is performed subsequent to an etching process to form a trench, as described in connection with FIGS. 8a through 8d.

Referring to FIGS. 6a through 6d, a silicon nitride layer is deposited on the resultant structure shown in FIGS. 5a through 5d for forming sidewall spacers on the protruding upper portion of the STI layer 112. The silicon nitride layer is preferably deposited by a LPCVD process or by a plasma-enhanced chemical vapor deposition (PECVD) process to a thickness of about 500–800 Å. The silicon nitride layer is anisotropically etched to form silicon nitride sidewall spacers 114 on sidewalls of the protruding upper portion of the STI layer 112. A thickness of the sidewall spacer is preferably about 500 Å. A thickness of the sidewall spacer 114 is an important consideration as this thickness determines a thickness of the vertical source/drain channels 121a, 121b.

Referring to FIGS. 7a through 7d, using the silicon nitride spacer 114 and the STI layer 112 as a mask, the active device region of the substrate 110 is etched using a reactive-ion-etching (RIE) process to form a trench in the active device area surrounded by the STI layer 112. An etching depth of the active device region is preferably about ⅔ of the STI layer 112 depth in the substrate 110. The trench etch depth is preferably about 2000 Å. The trench etch depth determines device channel width. The RIE etching process results in smooth parallel vertical semiconductor layer sidewalls and a flat bottom to the trench. The parallel vertical semiconductor layer sidewalls standing in contact with the STI layer 112 are subsequently used to form the device channel, source and drain regions.

Figure 8A:
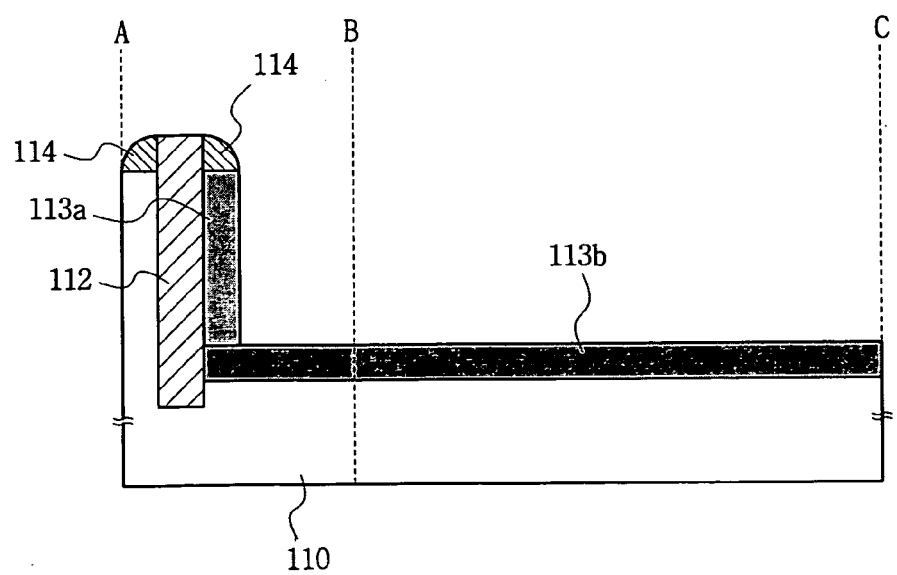
Figure 8B:
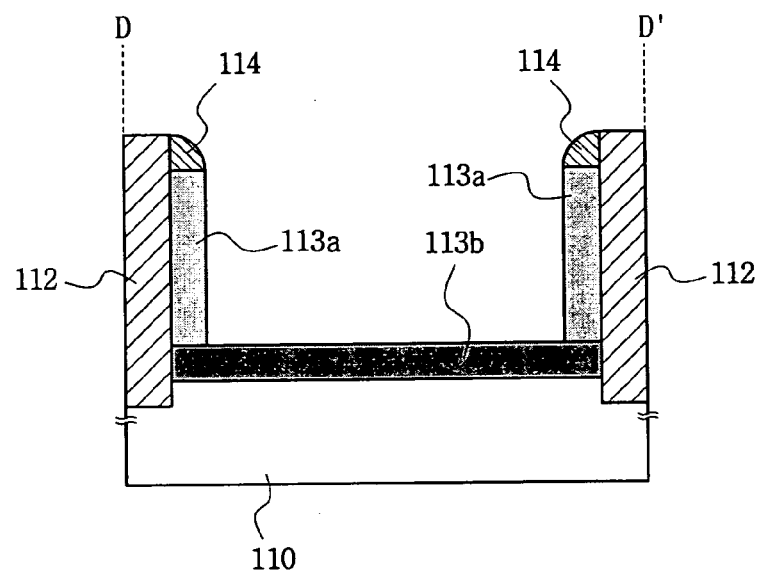
Figure 8C:
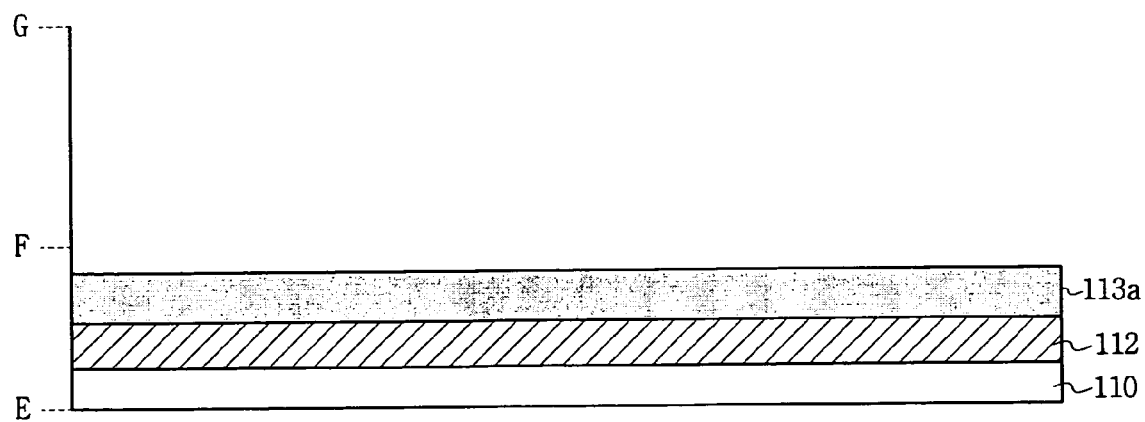
Figure 8D:
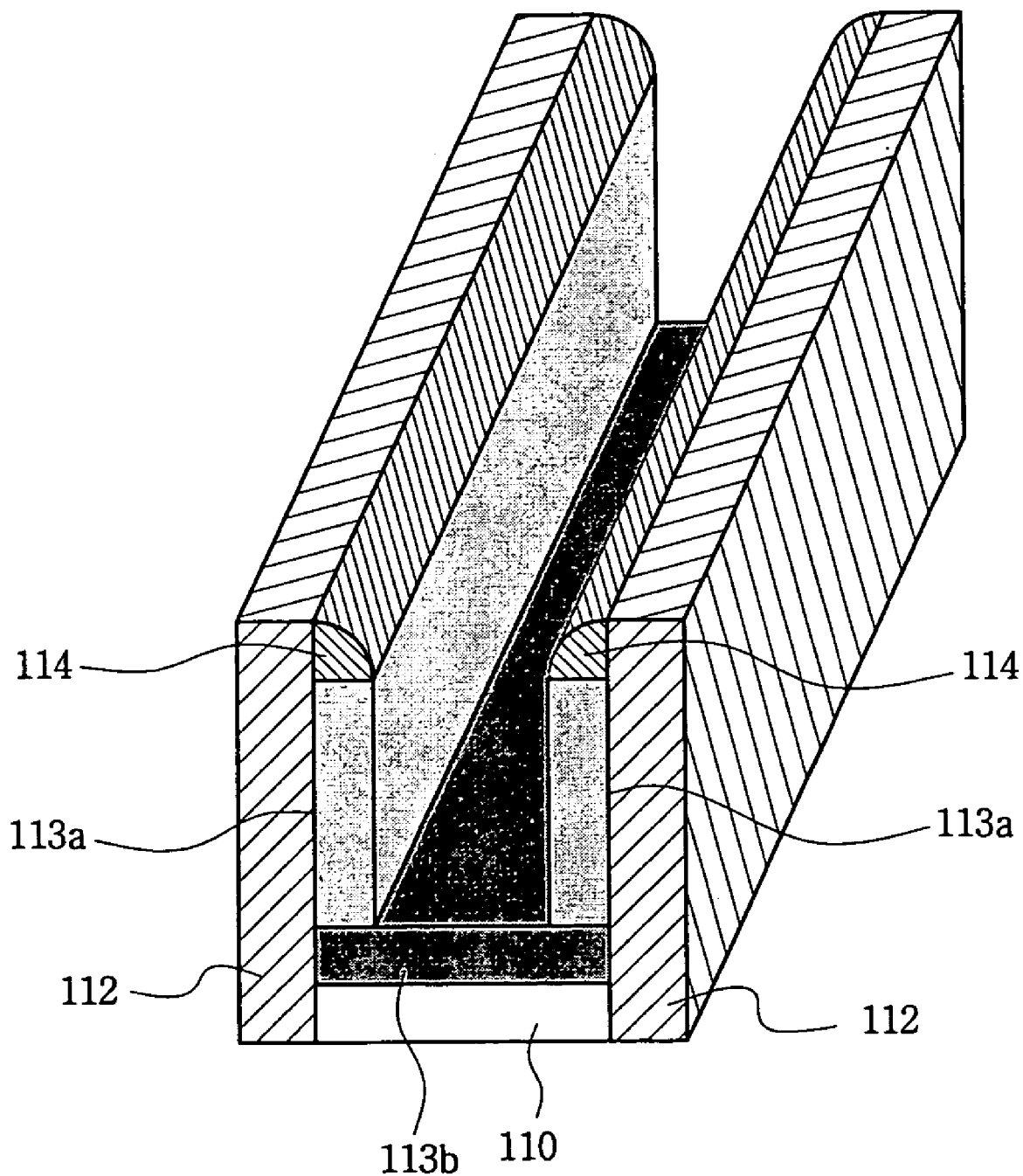
Figure 9A:
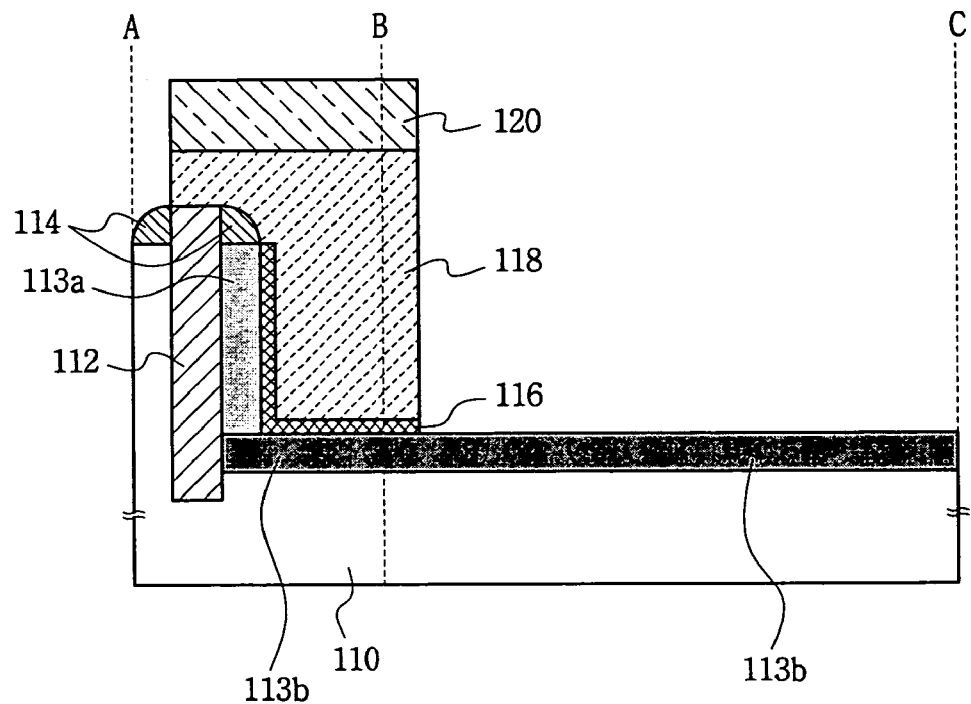
Figure 9B:
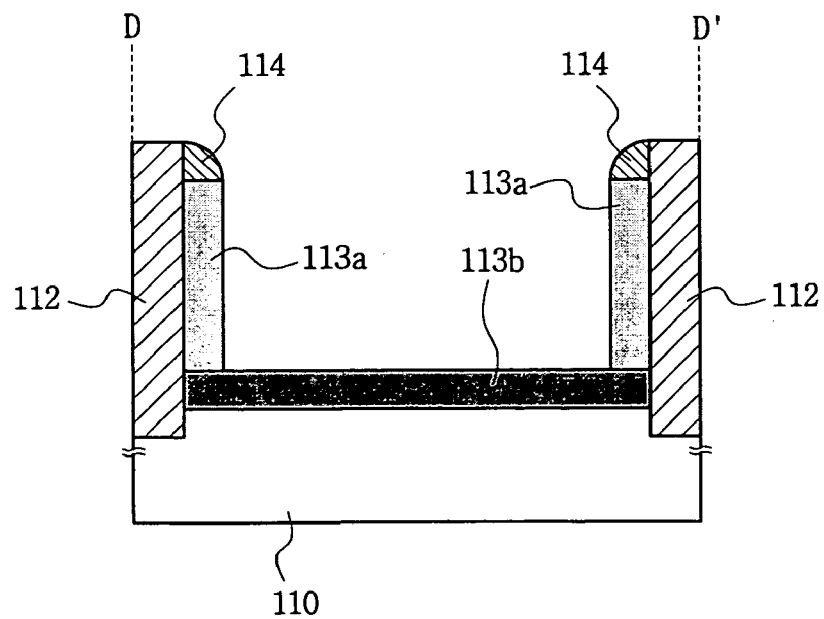
Figure 9C:
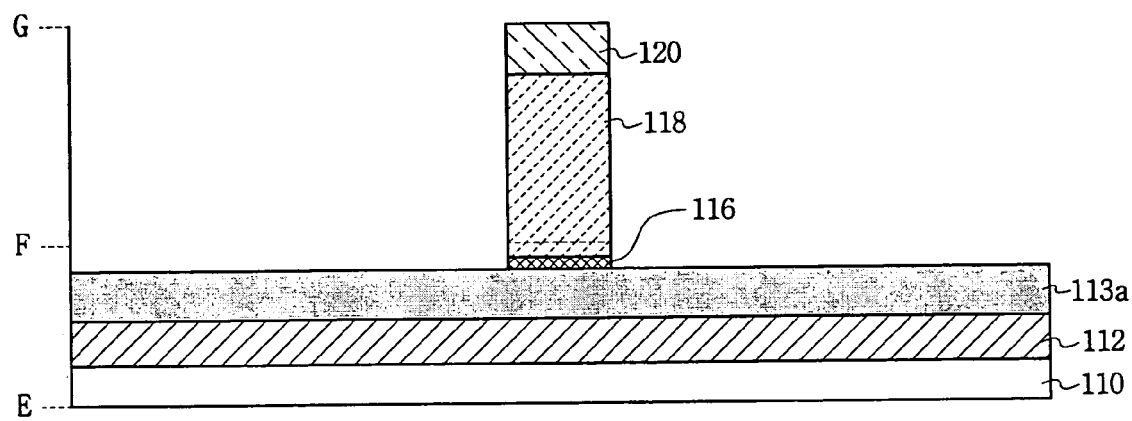
Figure 9D:
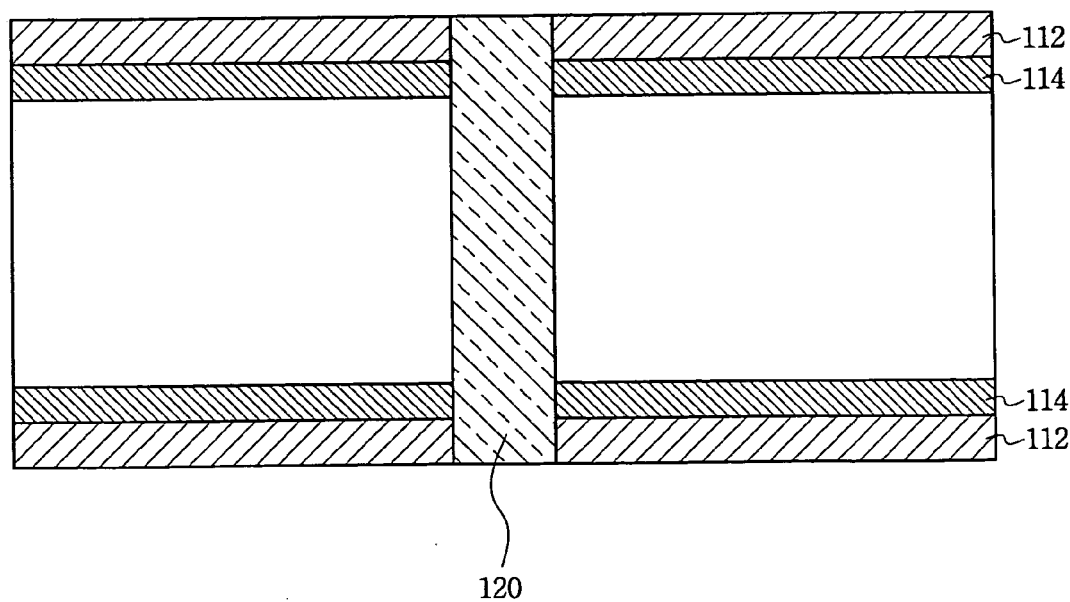
Figure 9E:
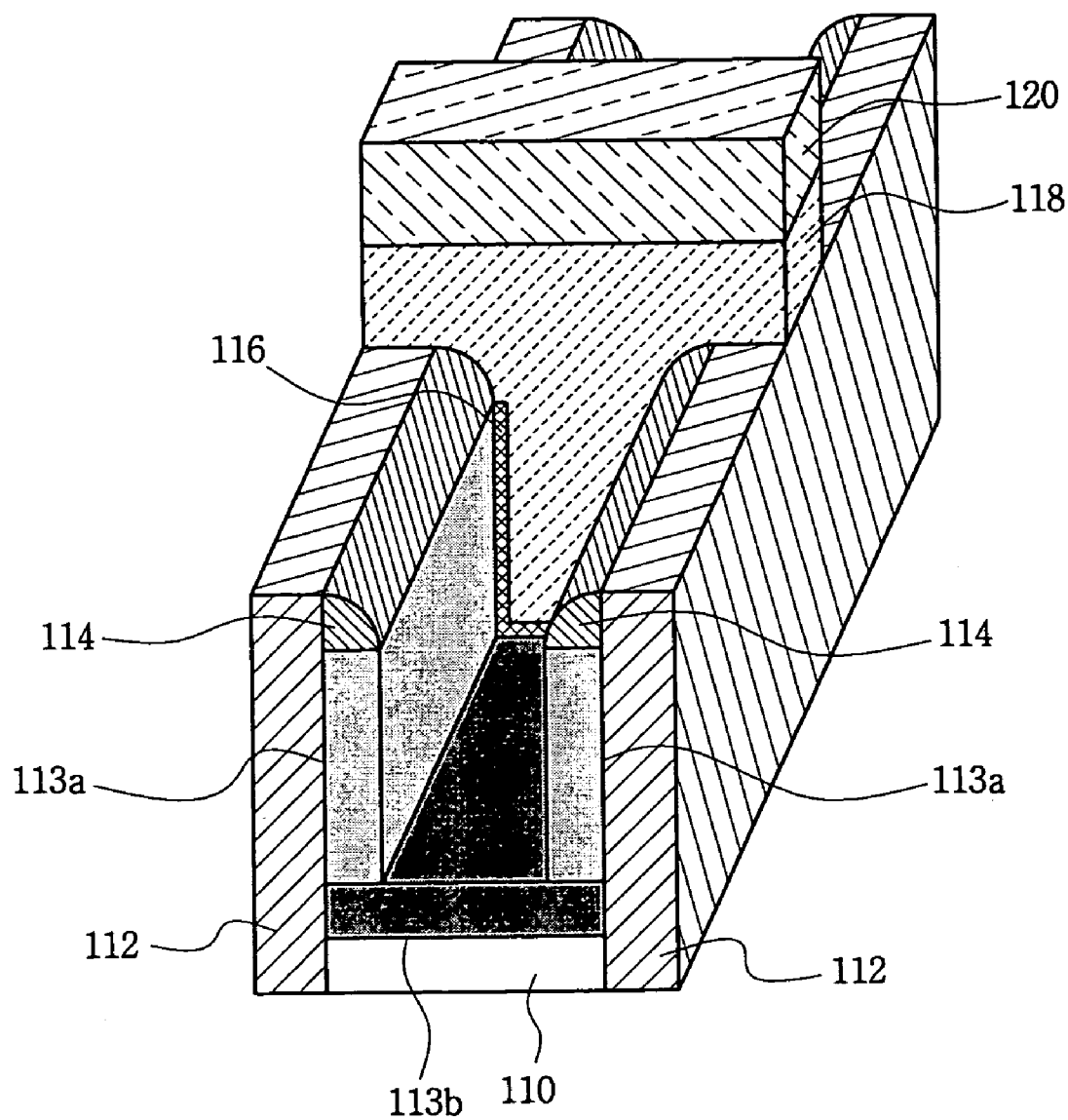
Figure 10A:
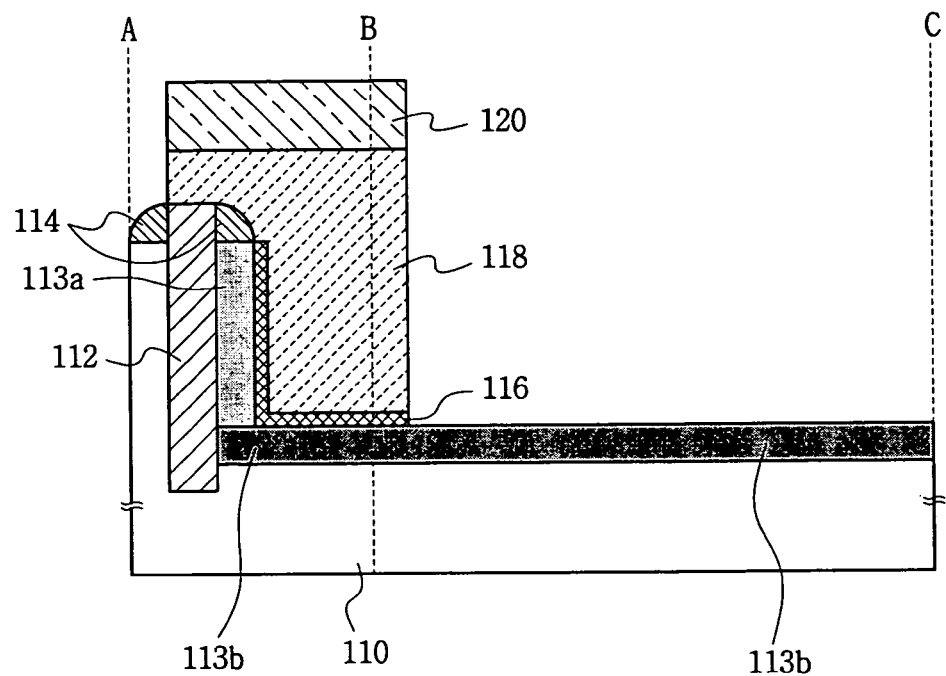
Figure 10B:
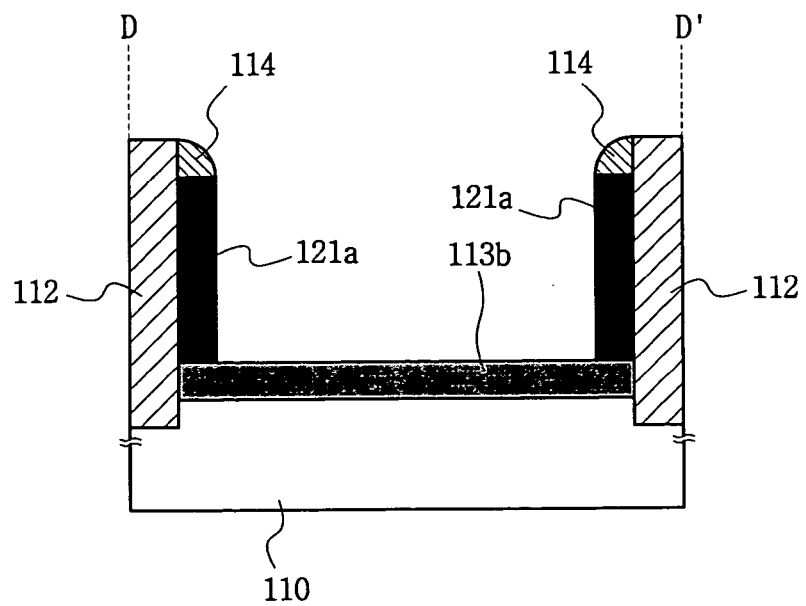
Figure 10C:
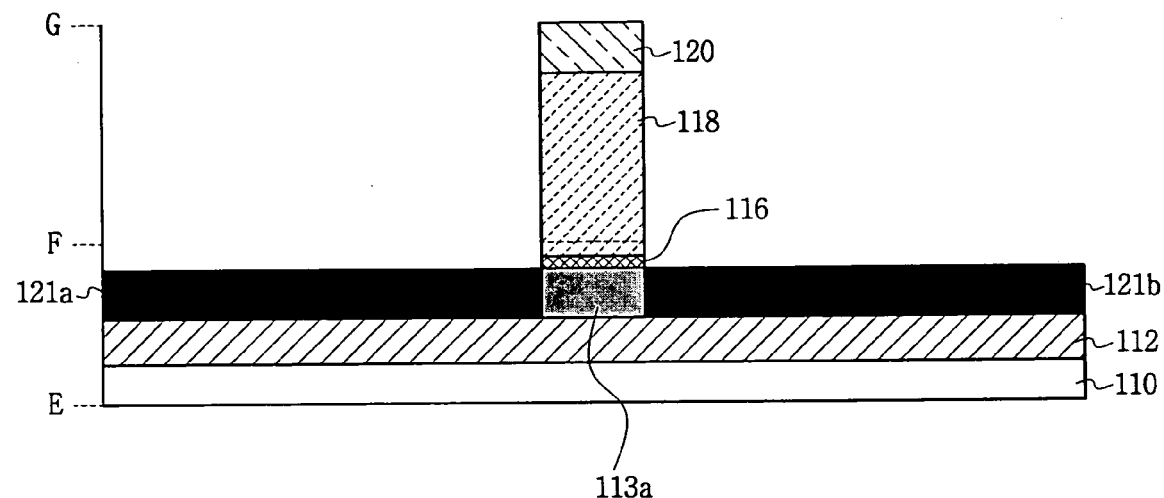
Figure 10D:
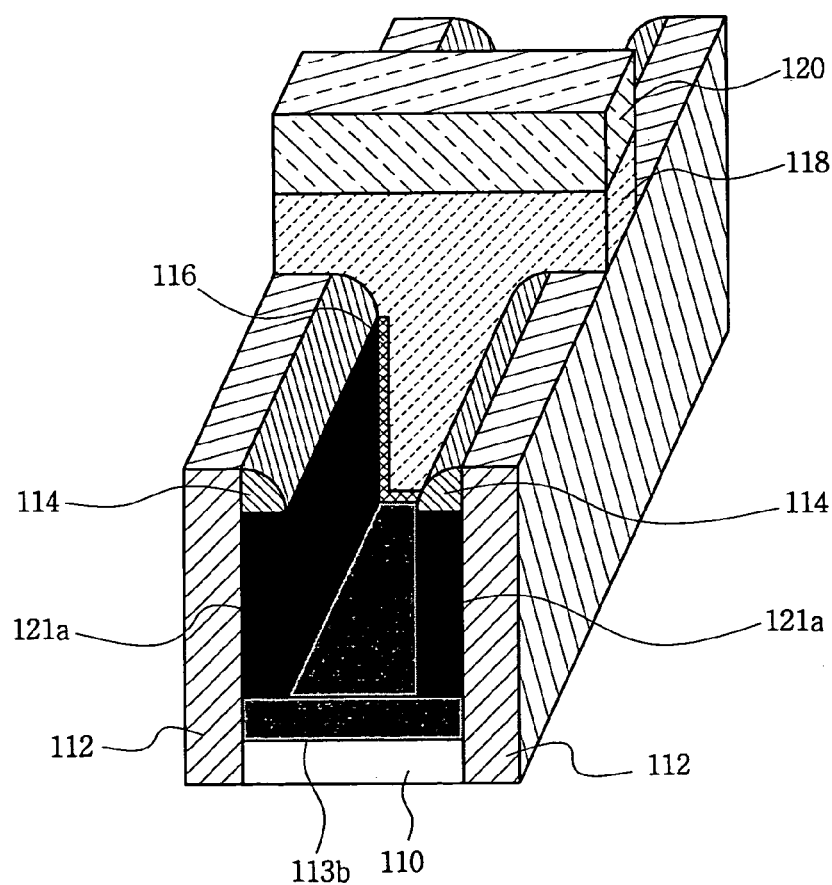
Figure 11A:
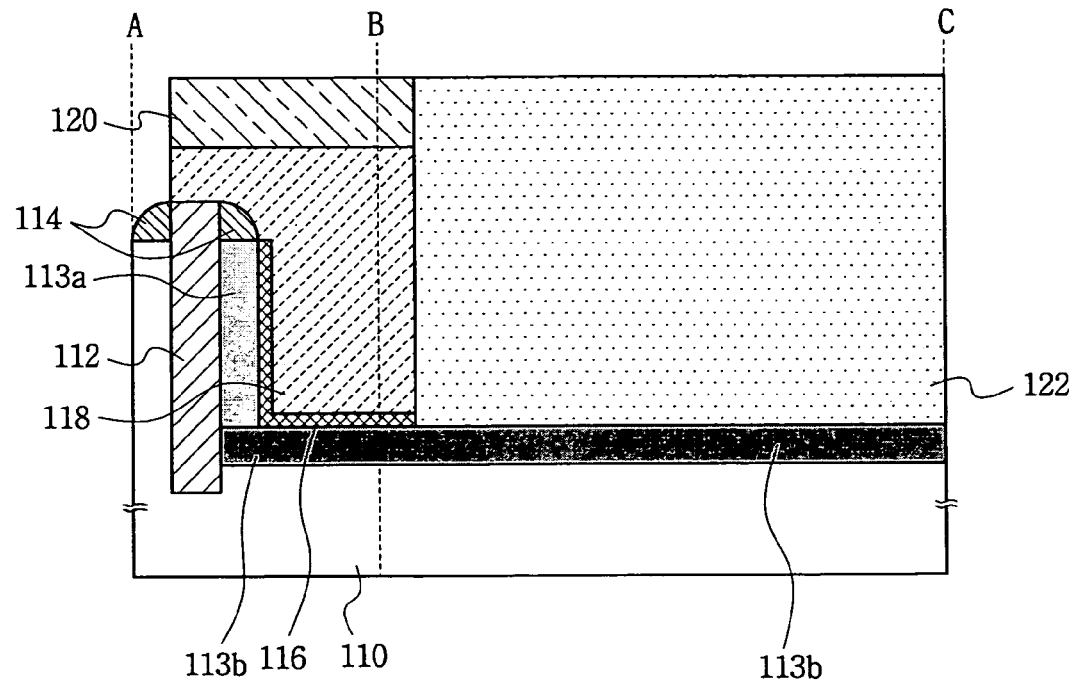
Figure 11B:
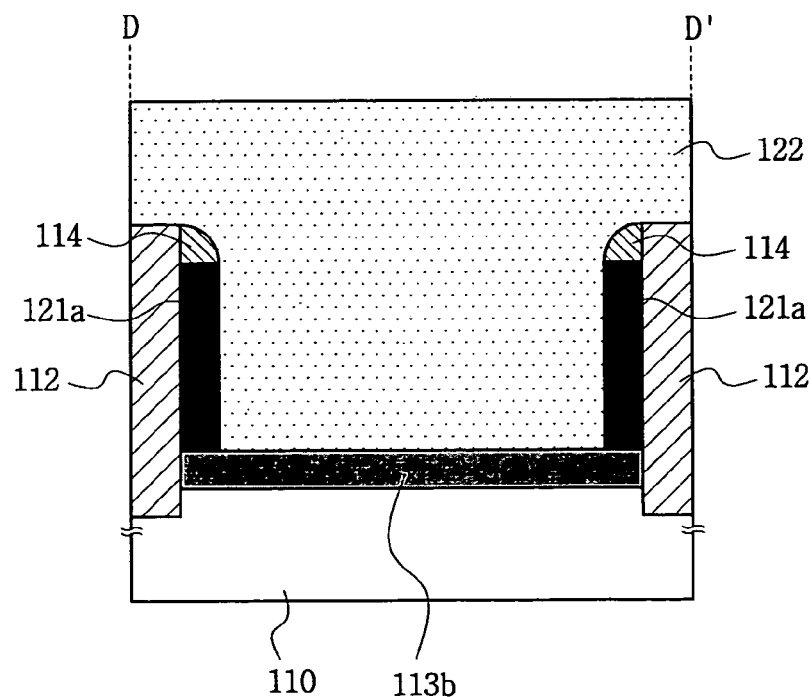
Figure 11C:
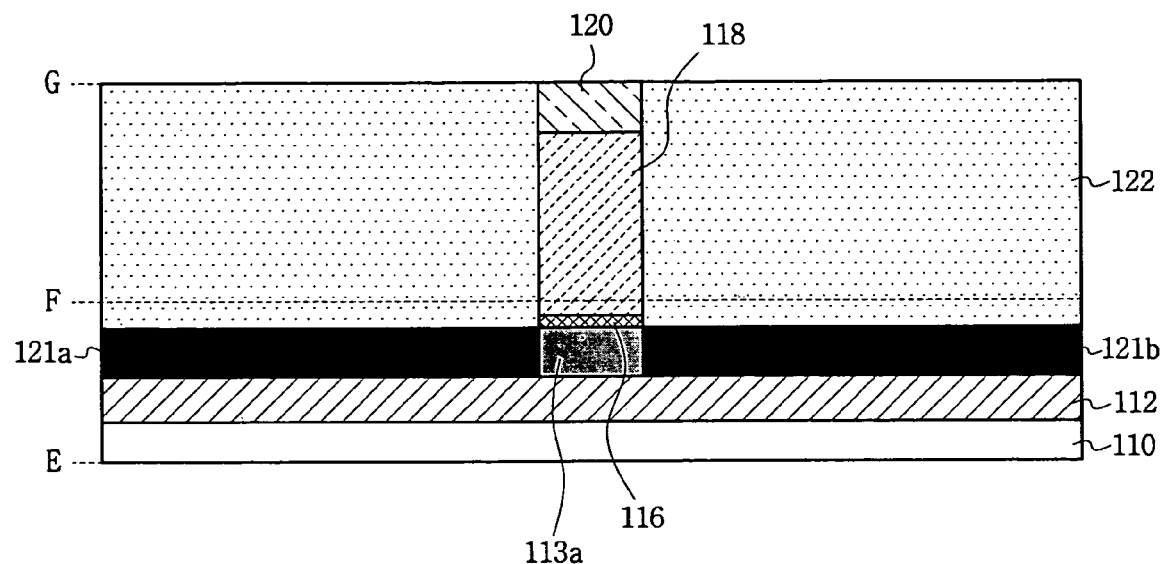
Figure 11D:
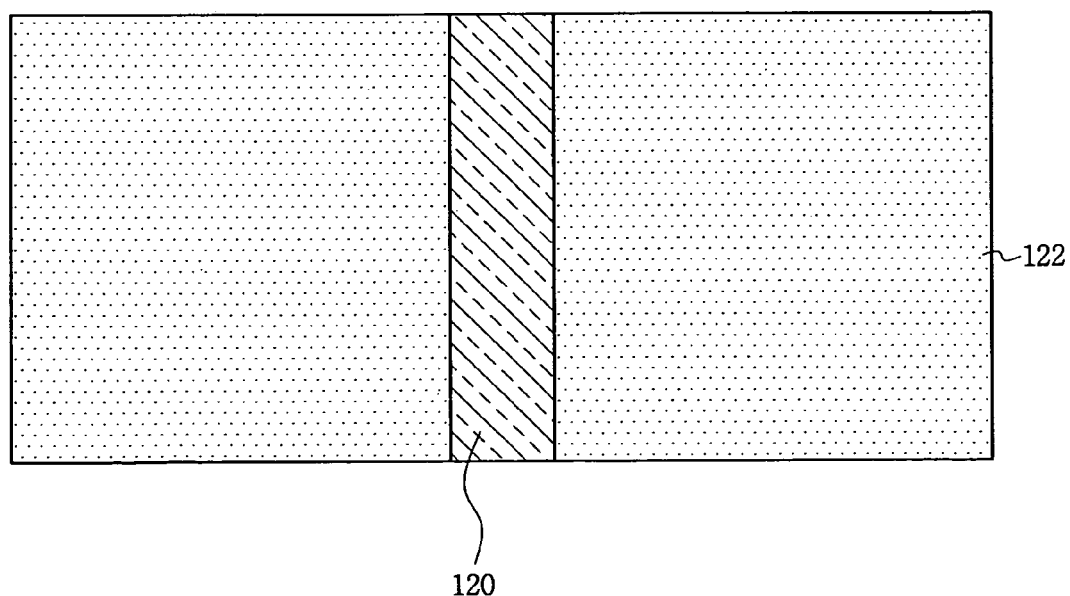
Figure 11E:
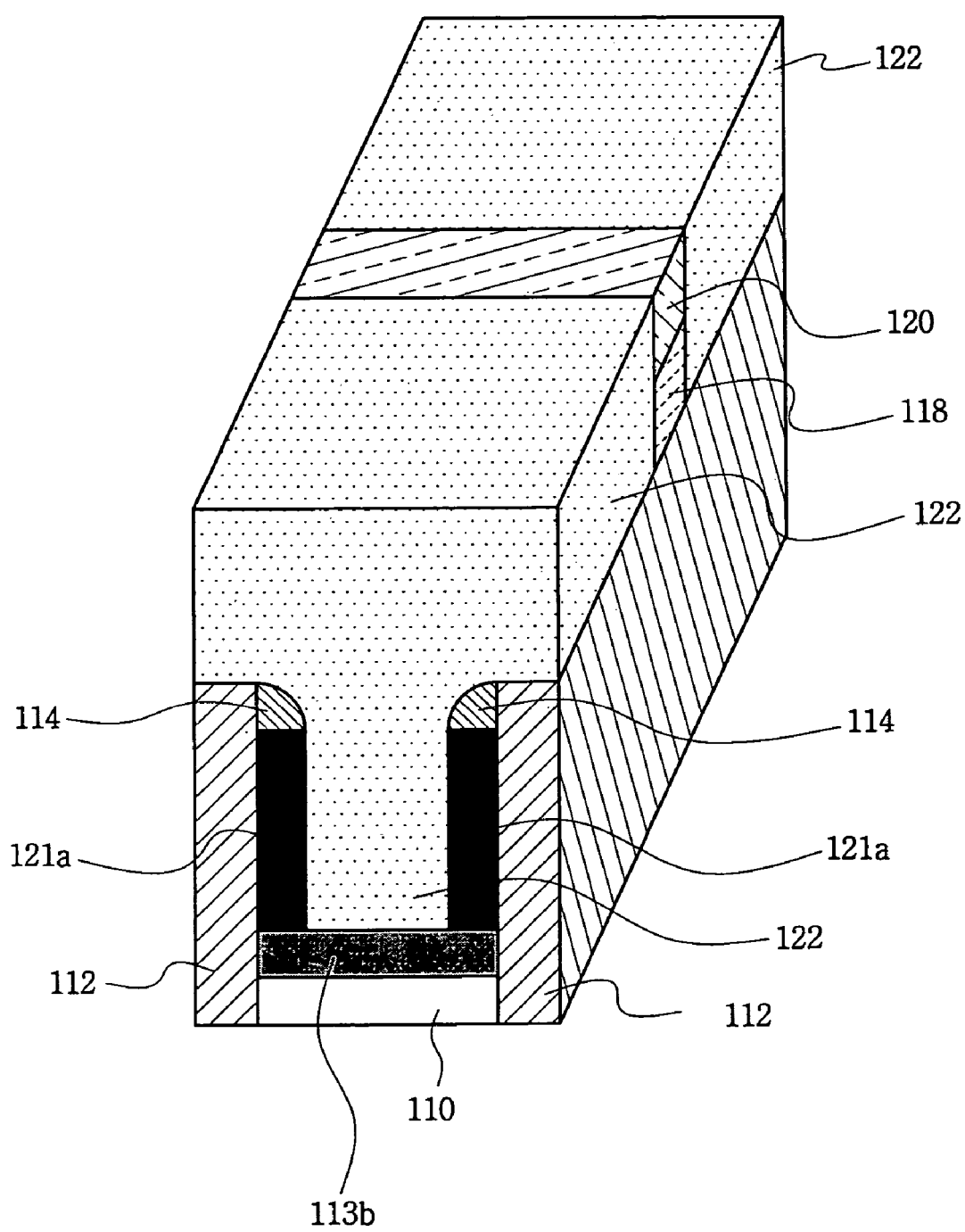
Figure 12A:
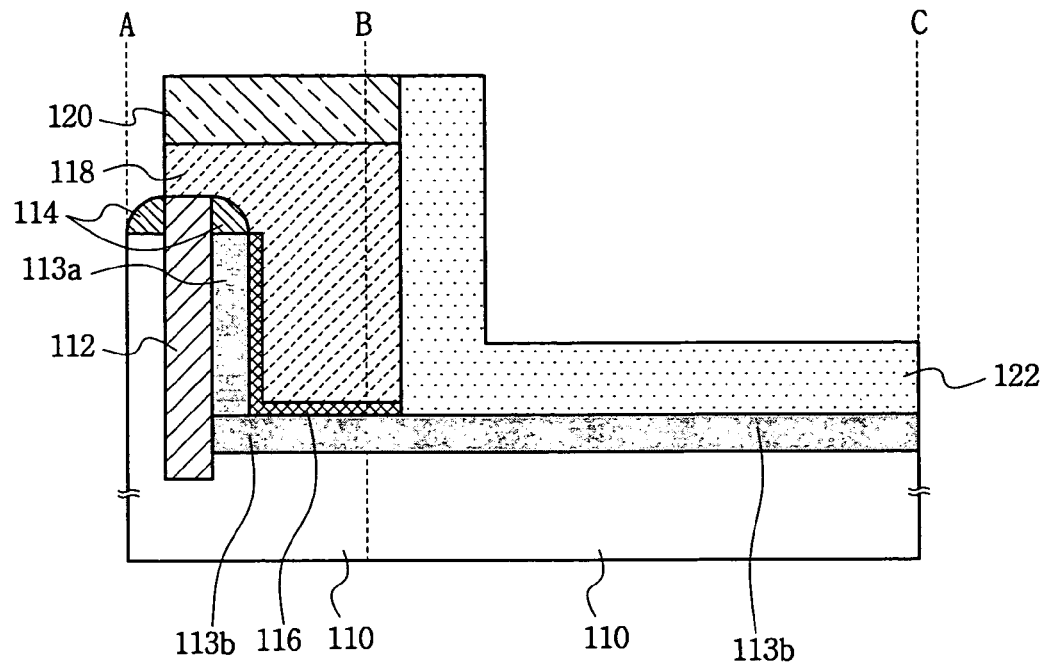
Figure 12B:
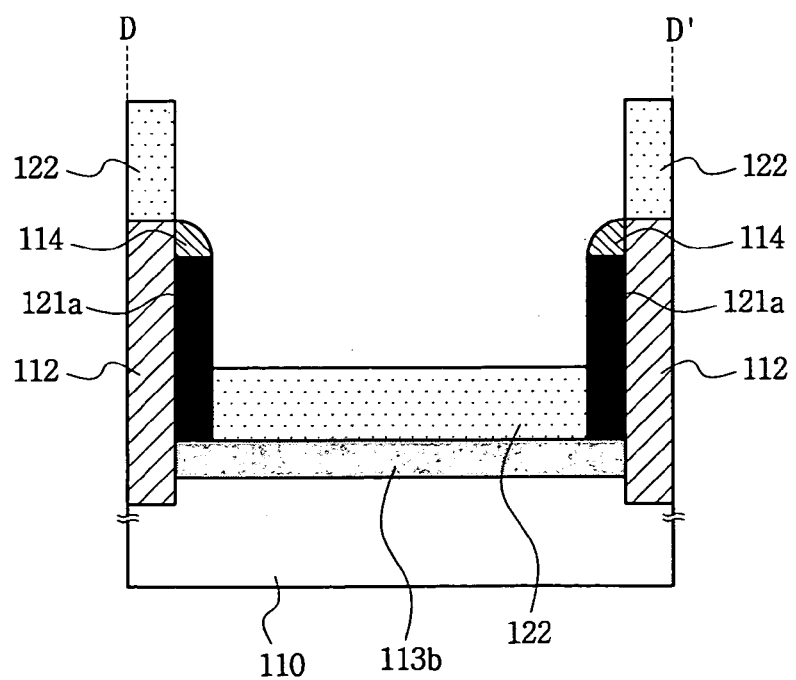
Figure 12C:
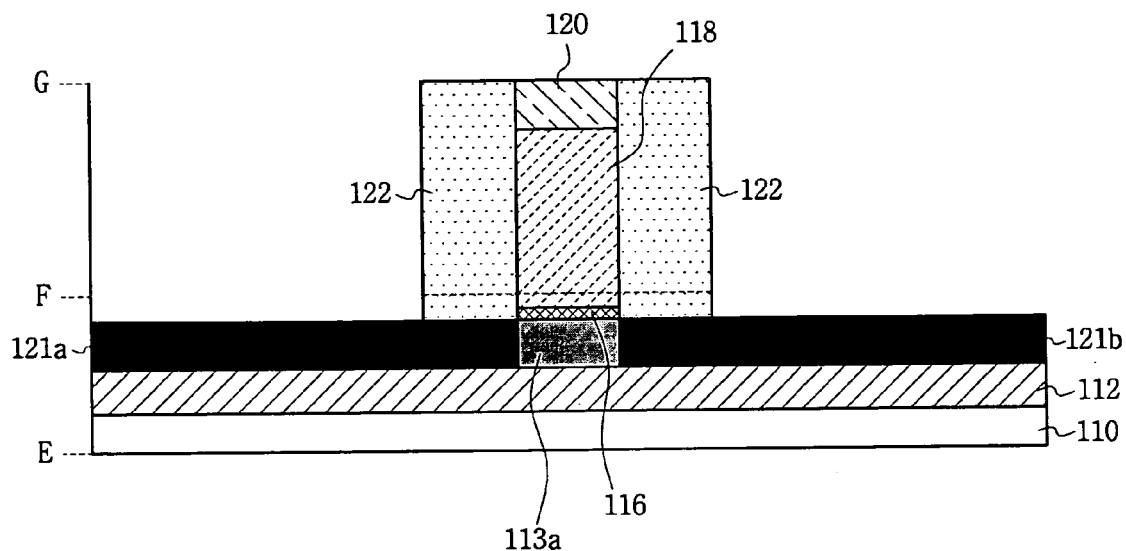
Figure 12D:
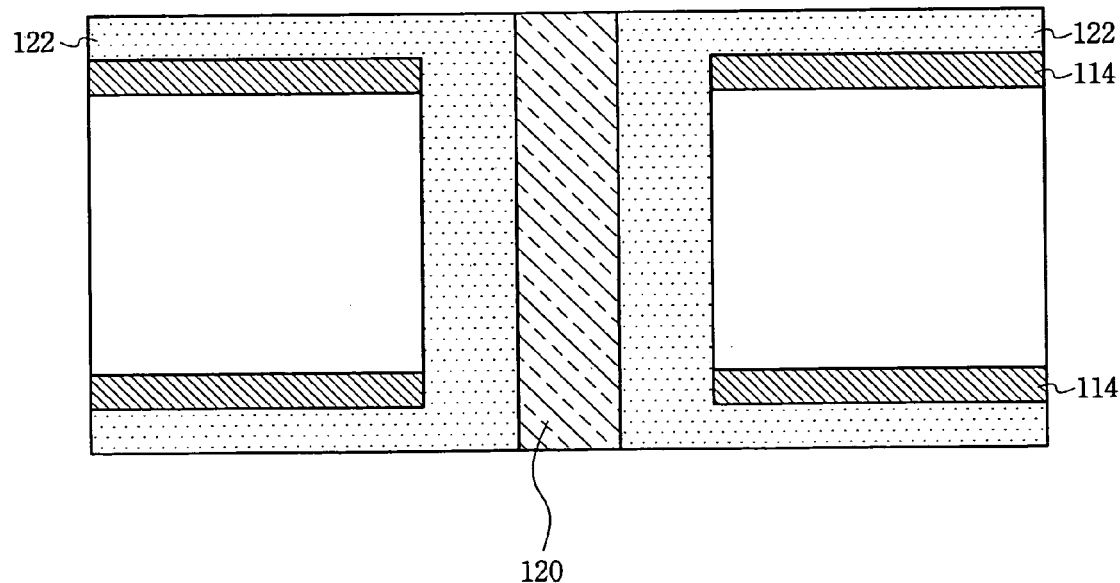
Figure 12E:
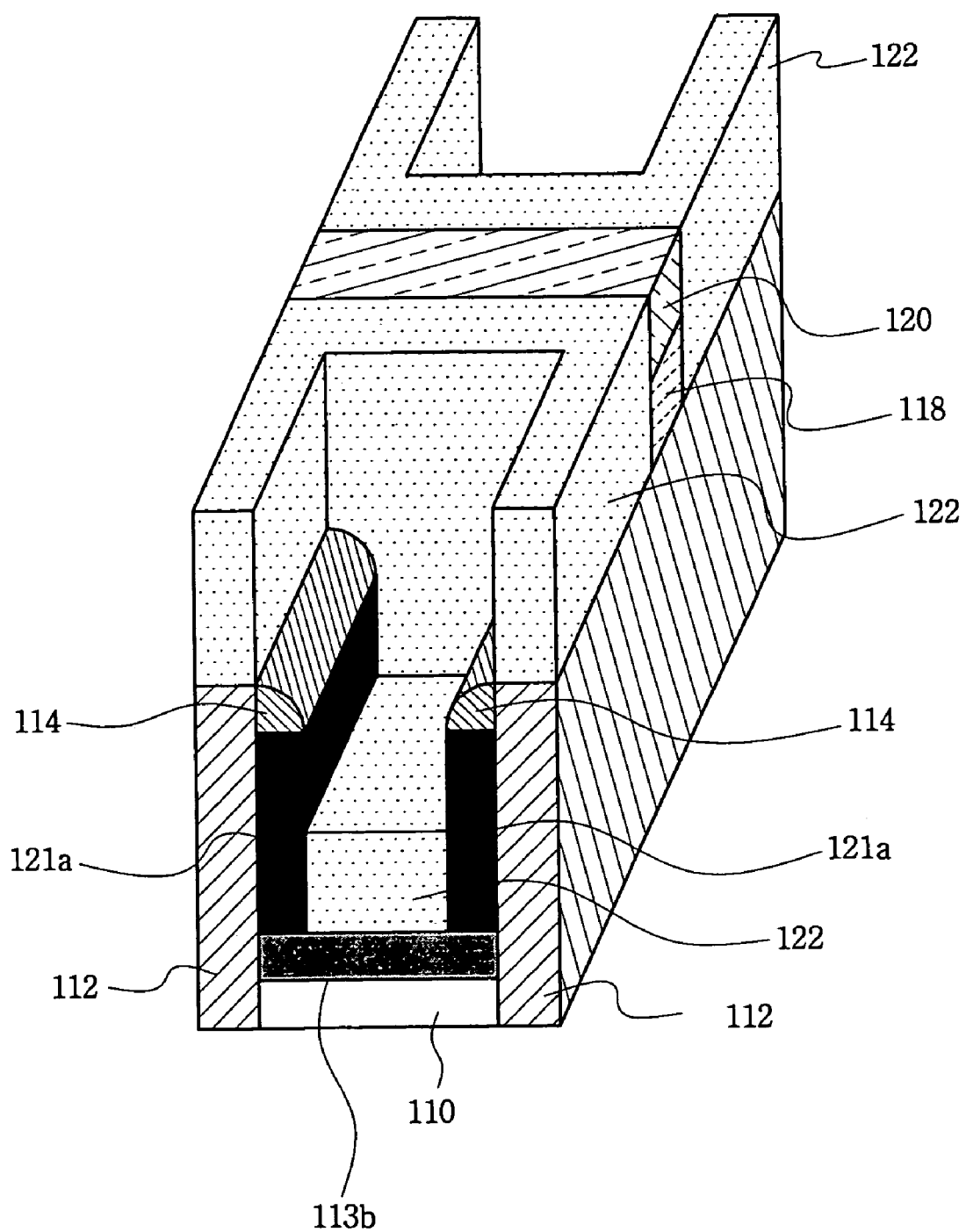
Figure 13A:
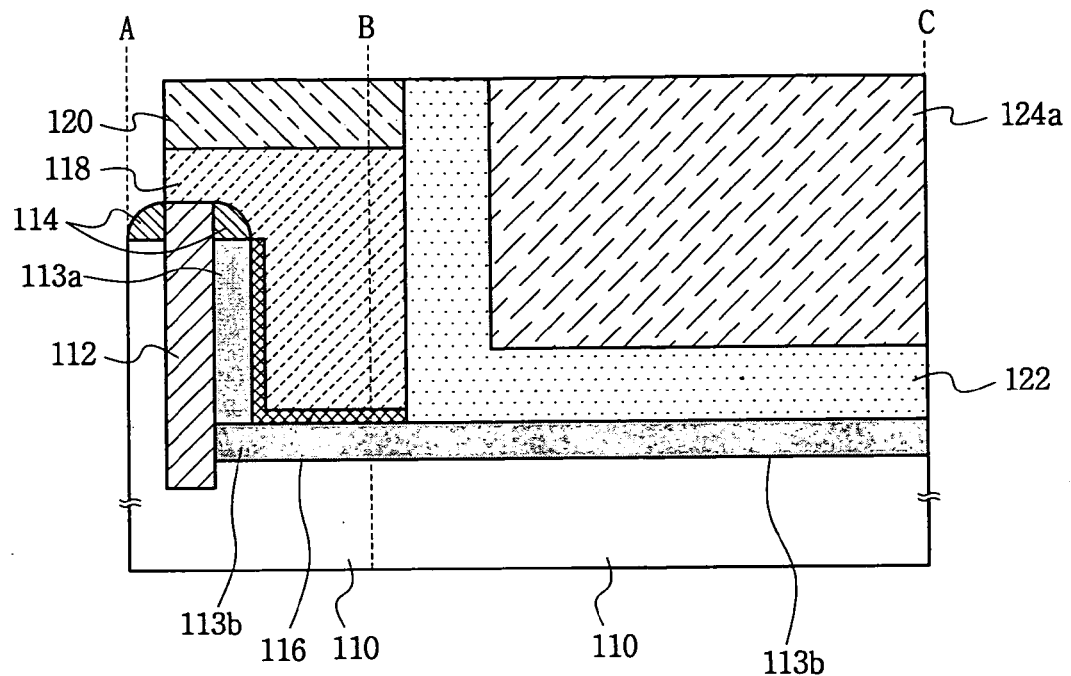
Figure 13B:
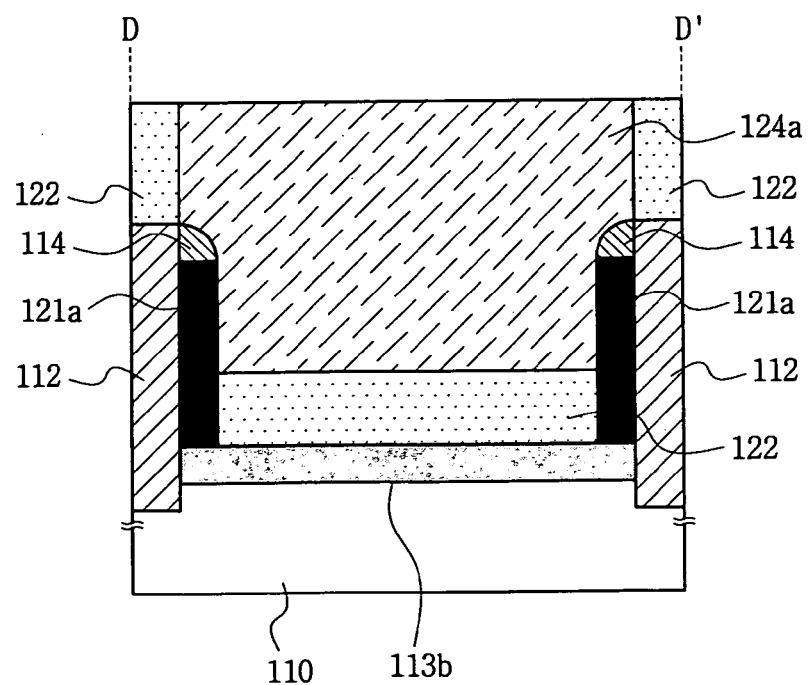
Figure 13C:
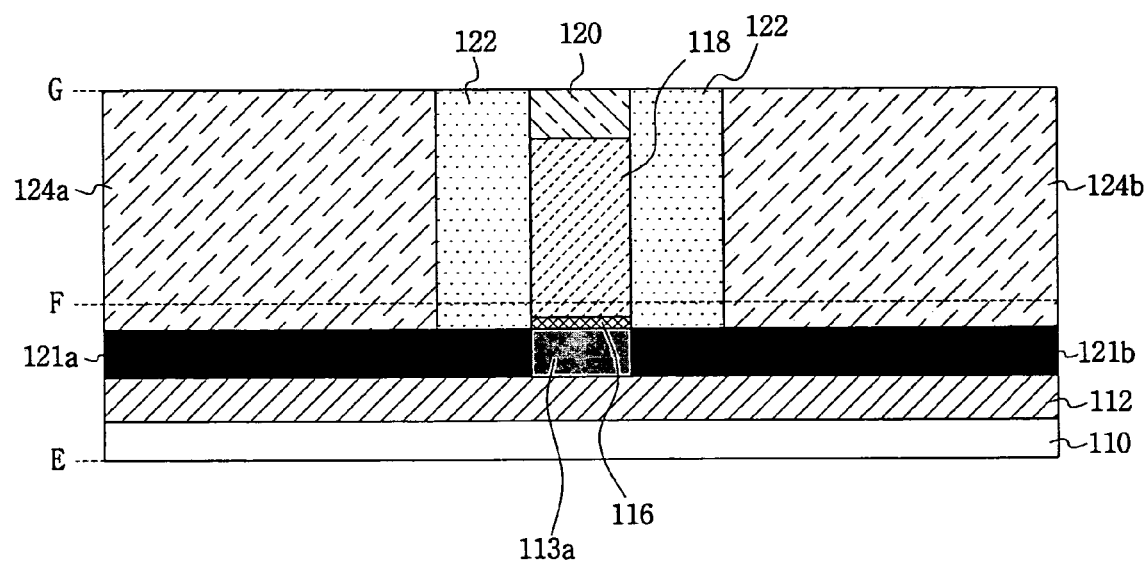
Figure 13D:
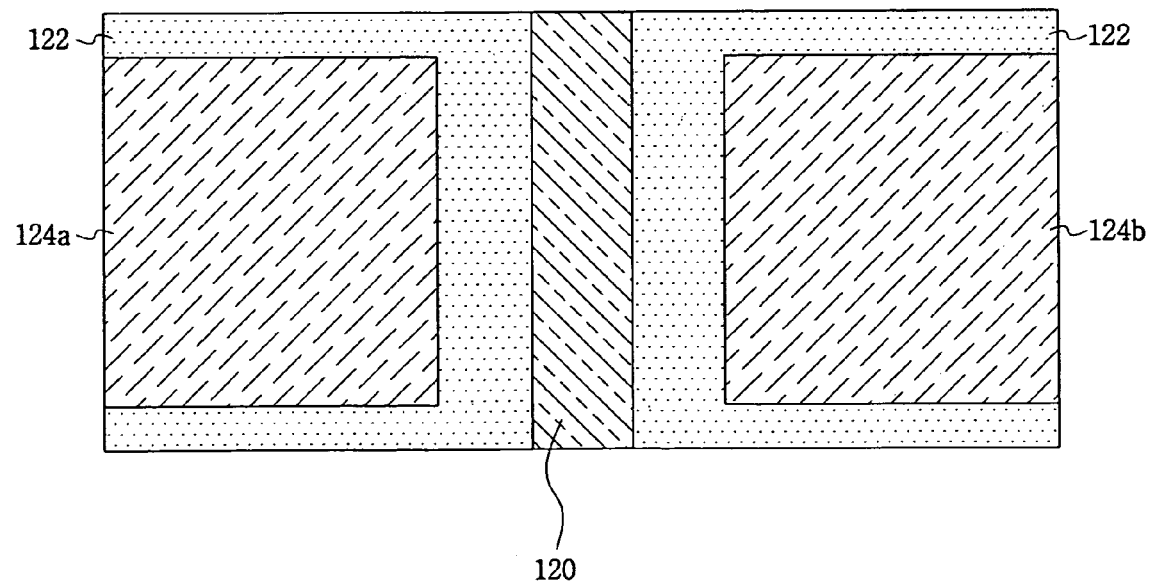
Figure 13E:
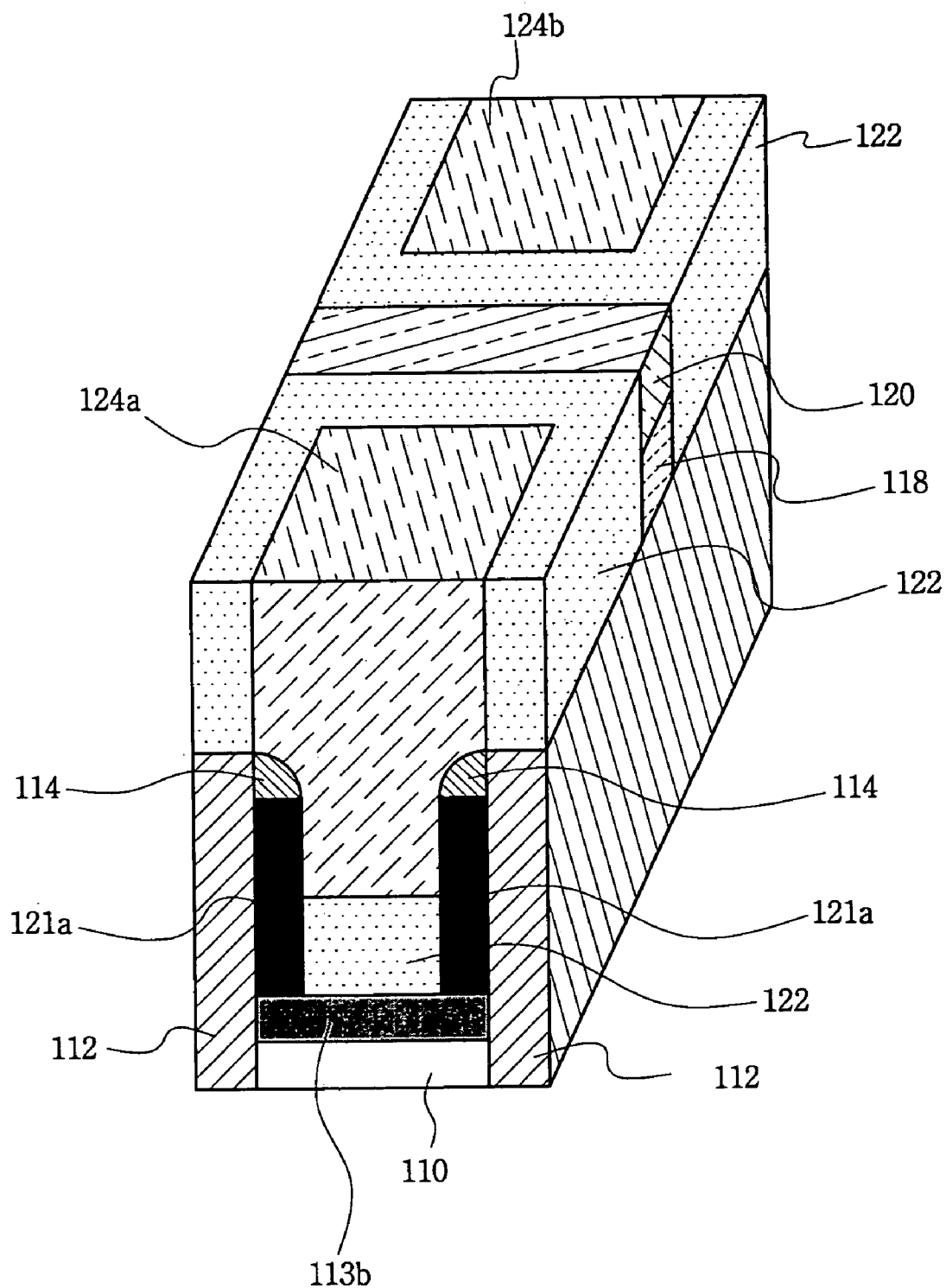

Referring to FIGS. 8a to 8d, a high-dose, zero-tilt angle $V_{th}$ control ion implantation, marked (1) in FIG. 8d is performed, preferably using $BF_2^+$ ions, to form a highly doped trench bottom channel surface 113b. This $V_{th}$ control implantation helps to maintain the trench bottom channel region turned "OFF" during normal device operation. The high-dose ion implantation process may set the trench bottom channel region $V_{th}$ value above the DC supply voltage, which will be used to power the transistor devices. The $V_{th}$ value of the trench bottom surface is preferably equal to or greater than about 2 V. Vertical sidewalls 113a of the trench are subjected to a low-dose doping process to control the $V_{th}$ of the vertical transistor channel region. The $V_{th}$ value of the vertical transistor channel region 113a is less than the $V_{th}$ value of the bottom channel region 113b. The low-dose vertical semiconductor layer sidewall doping process is accomplished by either a tilt-angle ion implantation process, marked (2) in FIG. 8d, or, more preferably, by a plasma doping process. The ions used in this process may be $BF_2^+$ ions. The tilt-angle during implantation preferably is about 7°. The tilt-angle ion implantation process, however, has a shadow effect problem. The shadow effect problem may be minimized or eliminated by selecting a small trench depth, which corresponds to a height of the vertical sidewall 113a. A relatively small trench depth limits the transistor channel width to a small value. Accordingly, trench depth and shadow effect must be balanced. Alternatively, the plasma doping process results in doping in a shallow region only, but does not suffer from the shadow effect problem. Although performing the initial ion implantation doping process at this time is preferable, the low dose ion implantation doping process (2) is not required if the optional initial ion implantation doping process, as described above in connection with FIGS. 5a through 5d, has been performed. The high dose ion implantation doping process (1), however, is still required to complete the bottom channel 113b.

Referring to FIGS. 9a through 9e, a gate oxide layer 116 is formed on vertical semiconductor layer sidewalls 113a and also on the exposed bottom portion 113b of the trench. The gate oxide layer 116 is preferably formed by thermal oxidation. A thickness of the gate oxide layer is preferably 50 Å. A gate electrode layer 118 is then deposited over the trench. The gate electrode layer is preferably made of tungsten silicide or tungsten. The gate electrode layer 118 is deposited preferably by a LPCVD process. The gate electrode layer is then planarized by an etch back process, which preferably is a CMP process. A gate mask layer 120, preferably made of silicon nitride, is then deposited on the planarized gate electrode layer 118, preferably by a LPCVD process. A gate pattern including a stack of the gate oxide layer 116, the gate electrode layer 118, and the gate mask layer 120, is then formed at a longitudinal midsection of the trench using photolithography and an etching process. After this processing step, the gate pattern stack, including the gate oxide layer 116, the gate electrode layer 118 and the gate mask layer 120, remains only at the longitudinal midsection of the trench, across the bottom area 113b, covering midsection portions of both parallel vertical semiconductor layer sidewalls 113a. The gate oxide layer 116 on the heavily doped bottom surface part 113b of the trench isolates the gate electrode layer 118 from the trench bottom surface part 113b. The threshold voltage of the gate electrode-gate oxide-trench bottom surface part 113b combination is higher due to the heavy doping of the trench bottom surface part as compared to the transistor channel region 113a on the vertical semiconductor layer sidewall of the trench.

Referring to FIGS. 10a through 10d, highly doped source/drain regions 121a/121b (region 121b is not shown in FIGS. 10a through 10d) are formed in the exposed vertical semiconductor layer sidewalls parts 113a on both sides of the gate pattern including the stack of the gate oxide layer 116, the gate electrode layer 118, and the gate mask layer 120. Ions used for the source/drain regions formation may be $As^+$ ions when the vertical semiconductor layer sidewall transistor channel region 113a has p-type conductivity. Highly doped source/drain regions 121a/121b may be formed by either a tilt-angle implantation process or, more preferably, by a plasma doping process. As previously described, however, the tilt-angle implantation process suffers from some shadow effect problem. The plasma doping process may be used for shallow region doping and does not exhibit any shadow effect.

Referring to FIGS. 11a through 11e, an oxide layer 122 is deposited over the trench and the gate mask layer 120, preferably by a LPCVD process. The oxide layer 122 is then planarized by an etch-back process. The etch-back process preferably is a CMP process. The gate mask layer 120 acts as an etch stop layer.

Referring to FIGS. 12a through 12e, the oxide layer 122 is anisotropically etched to form source/drain contact areas within the oxide layer 122. After this etching step, a portion of the oxide layer 122 remains on the highly doped bottom part 113b of the trench and exposes an upper portion of the highly doped source/drain regions 121a/121b on the vertical semiconductor layer sidewalls parts. After this etching step is performed, an un-etched portion of the oxide layer 122 remains on the STI layer 112 and also adjacent the gate pattern area including a stack of the gate oxide layer 116, the gate electrode layer 118, and the gate mask layer 120 in the center part of the trench.

Referring to FIGS. 13a through 13e, source/drain contact electrode layer 124 (not shown) is deposited over the etched oxide layer 122 within the source/drain contact area. The source/drain contact electrode is preferably made of doped polysilicon or tungsten. The source/drain contact electrode layer 124 is preferably deposited by a LPCVD process. The source/drain contact electrode layer 124 is then planarized by an etch-back process, preferably a CMP process, until the gate mask layer 120 and the oxide layer 122 are exposed. The etch-back process results in source/drain contact electrodes 124a and 124b, contacting the highly-doped source/drain regions 121a/121b on the vertical sidewalls parts of the trench exposed by the oxide layer 122, which remains on top of the highly-doped bottom part of the trench. The source/drain contact electrodes 124a and 124b connect the source/drain regions 121a/121b on one vertical semiconductor layer sidewall part of the trench with corresponding regions on the opposing vertical semiconductor layer sidewall part. The common gate electrode 118 and common source/drain electrodes 124a and 124b result in a vertical double-channel SOI transistor structure.

The structure of a device according to an embodiment of the present invention as illustrated in FIG. 3 results from this processing sequence.

After the processing sequence, as described above, the source, the drain and the gate regions of the two vertical sidewall parts are connected in parallel resulting in a device with a high "on" current without having to use much surface area of the substrate. This device additionally enjoys advantages of SOI devices, because the source, the drain and the channel regions are formed on the vertical silicon sidewalls standing in contact with the insulating (STI) layer.

A vertical double-channel SOI transistor according to an embodiment of the present invention can minimize or eliminate some of the problems associated with conventional device structures. Additionally, the vertical double-channel SOI transistor according to an embodiment of the present invention has several advantageous features. First, the vertical double-channel SOI transistor structure facilitates making low-cost, high performance integrated circuits. More specifically, the vertical double-channel SOI transistor can be made on a conventional bulk silicon substrate, thereby simplifying processing. Second, the body thickness of the vertical double-channel transistor is controlled by the thickness of a spacer formed on the shallow trench isolation (STI) layer, which surrounds the active device area. Therefore, device channel thickness is relatively easy to control in the vertical double-channel transistor structures. Third, since the vertical double-channel SOI transistor has a double channel on parallel vertical semiconductor layer walls of a trench in a semiconductor substrate, a large "on" current can be obtained even with limited supply voltages, thereby improving the device speed. Fourth, due to the vertical channel structure, it is easy to control the channel width of the vertical double-channel transistors without sacrificing the wafer surface area.

In the vertical double-channel SOI transistor according to an embodiment of the present invention, the MOSFET source, drain and channel regions are formed on two parallel vertical semiconductor layer sidewalls of a trench in a bulk semiconductor substrate. The vertical semiconductor layer sidewalls are in direct contact with the shallow-trench-insulating layer, which surrounds the semiconductor layer sidewall trench. Accordingly, in this device structure, the source, the drain and the channel regions of each vertical semiconductor layer sidewall are in direct contact with the shallow trench insulating layer, which results in most of the benefits of traditional lateral semiconductor-on-insulator (SOI) devices. In addition, a gate oxide layer is formed on top of the channel region of each vertical semiconductor layer sidewall, and then a gate electrode, a source electrode and a drain electrode are formed between the parallel vertical semiconductor layer sidewalls connecting the respective regions of the vertical semiconductor layer sidewalls. This structure results in an improved device performance compared to the traditional SOI devices, without sacrificing area of the semiconductor substrate surface.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a vertical double channel silicon-on-insulator (SOI) field effect transistor (FET), comprising:
    a. forming a pair of shallow trench isolation (STI) regions in an active region of a substrate so that an upper surface of the shallow trench isolation regions protrudes above an upper surface of the substrate;
    b. performing a first ion implantation process on the active region of the substrate to form a pair of vertical transistor channels and a bottom channel, wherein the pair of vertical transistor channels and the bottom channel extend in a longitudinal direction;
    c. forming sidewall spacers on the active region of the substrate above the pair of vertical transistor channels and adjacent to the protruding portion of the pair of shallow trench isolation regions;
    d. etching the active region of the substrate, using the sidewall spacers as a mask, to expose the pair of vertical transistor channels and the bottom channel, wherein the pair of vertical transistor channels and the bottom channel define a trench;
    e. performing a second ion implantation process on the exposed bottom channel;
    f. forming a gate oxide layer between the pair of vertical transistor channels on the bottom channel in a lateral direction at a midsection of the substrate;
    g. forming a gate electrode on the gate oxide layer, the sidewall spacers, and an upper surface of the pair of vertical shallow trench isolation regions;
    h. performing a third ion implantation process on the exposed pair of vertical transistor channels to form a pair of vertical source/drain regions;
    i. depositing an oxide layer on the bottom channel, the sidewall spacers, and an upper surface of the shallow trench isolation regions so that the oxide layer is adjacent to the gate oxide layer and the gate electrode, the oxide layer filling the trench;
    j. etching the oxide layer to expose an upper portion of the pair of vertical source/drain regions; and
    k. forming a source/drain contact electrode on the bottom channel and between the pair of vertical source/drain regions so that an upper surface of the source/drain contact electrode is even with an upper surface of the gate mask.

2. The method of manufacturing a vertical double channel silicon-on-insulator (SOI) field effect transistor (FET) as claimed in claim 1, further comprising:
    forming a gate mask on the gate electrode after forming the gate electrode.

3. The method of manufacturing a vertical double channel silicon-on-insulator (SOI) field effect transistor (FET) as claimed in claim 1, wherein forming the pair of STI regions comprises:
    a. depositing a mask layer on the substrate;
    b. performing an anisotropic etching process to remove the mask layer and form a pair of trench regions; and
    c. filling the pair of trench regions with an insulating layer.

4. The method of manufacturing a vertical double channel silicon-on-insulator (SOI) field effect transistor (FET) as claimed in claim 3, wherein the mask layer is a silicon nitride layer.

5. The method of manufacturing a vertical double channel silicon-on-insulator (SOI) field effect transistor (FET) as claimed in claim 3, wherein the etching process to remove the mask layer is a wet etching.

6. The method of manufacturing a vertical double channel silicon-on-insulator (SOI) field effect transistor (FET) as claimed in claim 1, wherein the first ion implantation process is a low dose implantation performed at an implant angle of 0°.

7. The method of manufacturing a vertical double channel silicon-on-insulator (SOI) field effect transistor (FET) as claimed in claim 1, wherein the second ion implantation process is a high dose implantation performed at an angle of 0°.

8. The method of manufacturing a vertical double channel silicon-on-insulator (SOI) field effect transistor (FET) as claimed in claim 1, wherein the third ion implantation process is performed at a tilted implant angle.

9. The method of manufacturing a vertical double channel silicon-on-insulator (SOI) field effect transistor (FET) as claimed in claim 8, wherein the tilted implant angle is 7°.

10. The method of manufacturing a vertical double channel silicon-on-insulator (SOI) field effect transistor (FET) as claimed in claim 1, wherein the third ion implantation process is a plasma doping process.

11. The method of manufacturing a vertical double channel silicon-on-insulator (SOI) field effect transistor (FET) as claimed in claim 1, wherein forming the sidewall spacer comprises:
    a. depositing a spacer layer on an upper surface of the substrate including the protruding portion of the shallow trench isolation region; and b. etching the spacer layer using an anisotropic etching method to form the sidewall spacers adjacent to the protruding portion of the shallow trench isolation region.

12. The method of manufacturing a vertical double channel silicon-on-insulator (SOI) field effect transistor (FET) as claimed in claim 11, wherein the spacer layer is formed by either a low-pressure chemical vapor deposition (LPCVD) silicon nitride or a plasma-enhanced chemical vapor deposition (PECVD) silicon nitride.

13. The method of manufacturing a vertical double channel silicon-on-insulator (SOI) field effect transistor (FET) as claimed in claim 12, wherein the spacer layer is deposited to a thickness of between about 500 Å to 800 Å.

14. The method of manufacturing a vertical double channel silicon-on-insulator (SOI) field effect transistor (FET) as claimed in claim 1, wherein the sidewall spacers have a thickness of about 500 Å.

15. The method of manufacturing a vertical double channel silicon-on-insulator (SOI) field effect transistor (FET) as claimed in claim 1, wherein the gate oxide layer is a thermally grown oxide.

16. The method of manufacturing a vertical double channel silicon-on-insulator (SOI) field effect transistor (FET) as claimed in claim 2, wherein forming the gate electrode and forming the gate mask comprises:
    depositing the gate electrode on the gate oxide layer, the sidewall spacers, and an upper surface of the pair of vertical shallow trench isolation regions using a low-pressure chemical vapor deposition (LPCVD) process;
    planarizing the gate electrode layer using a chemical mechanical polishing (CMP);
    depositing the gate mask on the planarized gate electrode layer using a LPCVD process; and
    patterning the gate mask and the gate electrode using photolithography and etching.

17. The method of manufacturing a vertical double channel silicon-on-insulator (SOI) field effect transistor (FET) as claimed in claim 1, wherein the gate electrode is formed of either tungsten silicide or tungsten.

18. The method of manufacturing a vertical double channel silicon-on-insulator (SOI) field effect transistor (FET) as claimed in claim 2, wherein the gate mask is a silicon nitride layer.

19. The method of manufacturing a vertical double channel silicon-on-insulator (SOI) field effect transistor (FET) as claimed in claim 1, wherein the source/drain contact electrode is formed of either doped polysilicon or tungsten.

20. The method of manufacturing a vertical double channel silicon-on-insulator (SOI) field effect transistor (FET) as claimed in claim 1, wherein the trench is etched using a reactive ion etching (RIE).

21. The method of manufacturing a vertical double channel silicon-on-insulator (SOI) field effect transistor (FET) as claimed in claim 1, wherein the trench is etched to a depth of about 2000 Å.

22. The method of manufacturing a vertical double channel silicon-on-insulator (SOI) field effect transistor (FET) as claimed in claim 1, wherein the shallow trench isolation regions have a depth of about 3000 Å.

23. The method of manufacturing a vertical double channel silicon-on-insulator (SOI) field effect transistor (FET) as claimed in claim 1, wherein the bottom channel has a high threshold voltage of equal to or greater than about 2 V.

24. The method of manufacturing a vertical double channel silicon-on-insulator (SOI) field effect transistor (FET) as claimed in claim 1, wherein an etching depth of the trench is approximately ⅔ of a depth of the shallow trench isolation region.

25. A method of manufacturing a vertical double channel silicon-on-insulator (SOI) field effect transistor (FET), comprising:
    a. forming a pair of shallow trench isolation (STI) regions in an active region of a substrate so that an upper portion of the shallow trench isolation regions protrudes above an upper surface of the substrate;
    b. forming sidewall spacers on the active region of the substrate adjacent to the protruding portion of the pair of shallow trench isolation regions;
    c. etching the active region of the substrate, using the sidewall spacers as a mask, to define a trench;
    d. performing a first ion implantation process on sidewalls and a bottom portion of the trench to form a pair of vertical transistor channels and a bottom channel, respectively, wherein the pair of vertical transistor channels and the bottom channel extend in a longitudinal direction;
    e. forming a gate oxide layer between the pair of vertical transistor channels on the bottom channel in a lateral direction at a midsection of the substrate;
    f. forming a gate electrode on the gate oxide layer, the sidewall spacers, and an upper surface of the pair of vertical shallow trench isolation regions;
    g. performing a second ion implantation process on the exposed pair of vertical transistor channels to form a pair of vertical source/drain regions;
    h. depositing an oxide layer on the bottom channel, the sidewall spacers, and an upper surface of the shallow trench isolation regions, wherein the oxide layer is adjacent to the gate oxide layer and the gate electrode, the oxide layer filling the trench;
    i. etching the oxide layer to expose an upper portion of the pair of vertical source/drain regions; and
    j. forming a source/drain contact electrode on the bottom channel and between the pair of vertical source/drain regions so that an upper surface of the source/drain contact electrode is even with an upper surface of the gate mask.

26. The method of manufacturing a vertical double channel silicon-on-insulator (SOI) field effect transistor (FET) as claimed in claim 25, further comprising:
    forming a gate mask on the gate electrode after forming the gate electrode.

27. The method of manufacturing a vertical double channel silicon-on-insulator (SOI) field effect transistor (FET) as claimed in claim 25, wherein forming the STI regions comprises:
    a. depositing a mask layer on the substrate;
    b. performing an anisotropic etching process to remove the mask layer and form a pair of trench regions; and
    c. filling the pair of trench regions with an insulating layer.

28. The method of manufacturing a vertical double channel silicon-on-insulator (SOI) field effect transistor (FET) as claimed in claim 27, wherein the mask layer is a silicon nitride layer.

29. The method of manufacturing a vertical double channel silicon-on-insulator (SOI) field effect transistor (FET) as claimed in claim 27, wherein the etching process to remove the mask layer is a wet etching.

30. The method of manufacturing a vertical double channel silicon-on-insulator (SOI) field-effect-transistor (FET) as claimed in claim 25, wherein the first ion implantation process comprises:

a tilted low dose ion implantation process to form the pair of vertical transistor channels; and a zero angle high dose ion implantation process to form the bottom channel.

31. The method of manufacturing a vertical double channel silicon-on-insulator (SOI) field-effect-transistor (FET) as claimed in claim 25, wherein the first ion implantation process comprises a plasma doping process.

32. The method of manufacturing a vertical double channel silicon-on-insulator (SOI) field effect transistor (FET) as claimed in claim 25, wherein the second ion implantation process is performed at a tilted implant angle.

33. The method of manufacturing a vertical double channel silicon-on-insulator (SOI) field effect transistor (FET) as claimed in claim 32, wherein the tilted implant angle is 7°.

34. The method of manufacturing a vertical double channel silicon-on-insulator (SOI) field effect transistor (FET) as claimed in claim 25, wherein the second ion implantation process is a plasma doping process.

35. The method of manufacturing a vertical double channel silicon-on-insulator (SOI) field effect transistor (FET) as claimed in claim 25, wherein forming the sidewall spacer comprises:
  a. depositing a spacer layer on an upper surface of the substrate including the protruding portion of the shallow trench isolation region; and
  b. etching the spacer layer using an anisotropic etching method to form the sidewall spacers adjacent to the protruding portion of the shallow trench isolation region.

36. The method of manufacturing a vertical double channel silicon-on-insulator (SOI) field effect transistor (FET) as claimed in claim 35, wherein the spacer layer is formed by either a low-pressure chemical vapor deposition (LPCVD) silicon nitride or a plasma-enhanced chemical vapor deposition (PECVD) silicon nitride.

37. The method of manufacturing a vertical double channel silicon-on-insulator (SOI) field effect transistor (FET) as claimed in claim 36, wherein the spacer layer is deposited to a thickness of between about 500 Å to 800 Å.

38. The method of manufacturing a vertical double channel silicon-on-insulator (SOI) field effect transistor (FET) as claimed in claim 25, wherein the sidewall spacers have a thickness of about 500 Å.

39. The method of manufacturing a vertical double channel silicon-on-insulator (SOI) field effect transistor (FET) as claimed in claim 25, wherein the gate oxide layer is a thermally grown oxide.

40. The method of manufacturing a vertical double channel silicon-on-insulator (SOI) field effect transistor (FET) as claimed in claim 26, wherein forming the gate electrode and forming the gate mask comprises:

depositing the gate electrode on the gate oxide layer, the sidewall spacers, and an upper surface of the pair of vertical shallow trench isolation regions using a low-pressure chemical vapor deposition (LPCVD) process;

planarizing the gate electrode layer using a chemical mechanical polishing (CMP);

depositing the gate mask on the planarized gate electrode layer using a LPCVD process; and patterning the gate mask and the gate electrode using photolithography and etching.

41. The method of manufacturing a vertical double channel silicon-on-insulator (SOI) field effect transistor (FET) as claimed in claim 25, wherein the gate electrode is formed of either tungsten silicide or tungsten.

42. The method of manufacturing a vertical double channel silicon-on-insulator (SOI) field effect transistor (FET) as claimed in claim 26, wherein the gate mask is a silicon nitride layer.

43. The method of manufacturing a vertical double channel silicon-on-insulator (SOI) field effect transistor (FET) as claimed in claim 25, wherein the source/drain contact electrode is formed of either doped polysilicon or tungsten.

44. The method of manufacturing a vertical double channel silicon-on-insulator (SOI) field effect transistor (FET) as claimed in claim 25, wherein the trench is etched using a reactive ion etching (RIE).

45. The method of manufacturing a vertical double channel silicon-on-insulator (SOI) field effect transistor (FET) as claimed in claim 25, wherein the trench is etched to a depth of about 2000 Å.

46. The method of manufacturing a vertical double channel silicon-on-insulator (SOI) field effect transistor (FET) as claimed in claim 25, wherein the shallow trench isolation regions have a depth of about 3000 Å.

47. The method of manufacturing a vertical double channel silicon-on-insulator (SOI) field effect transistor (FET) as claimed in claim 25, wherein the bottom channel has a high threshold voltage of equal to or greater than about 2 V.

48. The method of manufacturing a vertical double channel silicon-on-insulator (SOI) field effect transistor (FET) as claimed in claim 25, wherein an etching depth of the trench is approximately $2/3$ of a depth of the shallow trench isolation region.

* * * * *